(12) United States Patent
Carter et al.

(10) Patent No.: US 7,200,934 B2
(45) Date of Patent: Apr. 10, 2007

(54) ELECTRONIC ASSEMBLIES WITH HIGH CAPACITY HEAT SINKS AND METHODS OF MANUFACTURE

(75) Inventors: Daniel P. Carter, Bainbridge Island, WA (US); Michael T. Crocker, Tacoma, WA (US); Ben M. Broili, Tacoma, WA (US); Tod A. Byquist, Tukwilla, WA (US); David J. Llapitan, Puyallup, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/656,968

(22) Filed: Sep. 5, 2003

(65) Prior Publication Data

US 2004/0045163 A1 Mar. 11, 2004

Related U.S. Application Data

(62) Division of application No. 09/950,100, filed on Sep. 10, 2001, now Pat. No. 6,671,172.

(51) Int. Cl.
*B21D 53/02* (2006.01)
*H05K 7/20* (2006.01)
*H01L 23/34* (2006.01)

(52) U.S. Cl. .................................. 29/890.03
(58) Field of Classification Search ............. 29/890.03; 165/80.3, 121, 122, 125, 126, 185; 257/722; 361/687, 688, 694–697, 703, 704, 707, 710; 415/177, 178

See application file for complete search history.

(56) References Cited

U.S. PATENT DOCUMENTS 898,107 A 9/1908 Hill 2,337,294 A 12/1943 Cooper .................. 219/10
3,182,114 A * 5/1965 Burgess et al. ............ 174/16.3

(Continued)

FOREIGN PATENT DOCUMENTS

EP 0860874 8/1998

(Continued)

OTHER PUBLICATIONS

"High-Performance Fin Design For A Fan-Mounted Heat Sink", *IBM Technical Disclosure Bulletin, IBM Corp. New York*, vol. 37, NR.11 ISSN: 0018-8689,417-418.

(Continued)

*Primary Examiner*—Essama Omgba
(74) *Attorney, Agent, or Firm*—Schwegman, Lundberg, Woessner & Kluth P.A.

(57) ABSTRACT

An electronic assembly comprising one or more high performance integrated circuits includes at least one high capacity heat sink. The heat sink, which comprises a number of fins projecting substantially radially from a core, is structured to capture air from a fan and to direct the air to optimize heat transfer from the heat sink. The heat sink fins can be formed in different shapes. In one embodiment, the fins are curved. In another embodiment, the fins are bent. In yet another embodiment, the fins are curved and bent. Methods of fabricating heat sinks and electronic assemblies, as well as application of the heat sink to an electronic assembly and to an electronic system, are also described.

30 Claims, 18 Drawing Sheets

U.S. PATENT DOCUMENTS

| | | | |
|---|---|---|---|
| 3,187,082 A | 6/1965 | Allison | 174/35 |
| 3,239,003 A | 3/1966 | Boudette et al. | 165/185 |
| 3,466,909 A | 9/1969 | Weber | 72/68 |
| 3,779,291 A | 12/1973 | Yeo | 140/147 |
| 4,354,729 A | 10/1982 | Grabbe et al. | 339/258 R |
| 4,520,541 A | 6/1985 | Miki et al. | 29/156.8 |
| 4,645,279 A | 2/1987 | Grabbe et al. | 339/17 CF |
| 4,699,593 A | 10/1987 | Grabbe et al. | 439/71 |
| 4,726,739 A | 2/1988 | Saitou et al. | 417/286 |
| 4,733,293 A | 3/1988 | Gabuzda | 357/81 |
| 4,940,432 A | 7/1990 | Consoli et al. | 439/862 |
| 4,959,029 A | 9/1990 | Grabbe | 439/862 |
| 4,997,034 A | 3/1991 | Steffen et al. | 165/104.34 |
| 5,019,880 A | 5/1991 | Higgins, III | |
| 5,035,629 A | 7/1991 | Matsuoka | 439/70 |
| 5,132,780 A | 7/1992 | Higgins, III | 357/81 |
| 5,286,208 A | 2/1994 | Matsuoka | 439/72 |
| 5,299,090 A | 3/1994 | Brady et al. | 361/703 |
| 5,365,400 A | 11/1994 | Ashiwake et al. | |
| 5,375,652 A | 12/1994 | Matsunaga et al. | 165/80.3 |
| 5,437,327 A | 8/1995 | Chiou | 165/122 |
| 5,505,257 A | 4/1996 | Goetz, Jr. | 165/183 |
| 5,545,045 A | 8/1996 | Wakamatsu | 439/70 |
| 5,597,034 A | 1/1997 | Barker, III et al. | 165/80.3 |
| 5,661,638 A * | 8/1997 | Mira | 361/697 |
| 5,704,416 A | 1/1998 | Larson et al. | 165/104.33 |
| 5,777,844 A | 7/1998 | Kiefer | |
| 5,780,928 A | 7/1998 | Rostoker et al. | |
| 5,785,116 A | 7/1998 | Wagner | 165/80.3 |
| 5,794,685 A | 8/1998 | Dean | 165/121 |
| 5,800,184 A | 9/1998 | Lopergolo et al. | 439/66 |
| 5,920,458 A | 7/1999 | Azar | |
| 5,975,194 A | 11/1999 | Wagner | 165/80.3 |
| 6,152,214 A * | 11/2000 | Wagner | 165/121 |
| 6,176,299 B1 | 1/2001 | Hanzlik et al. | 165/80.3 |
| 6,196,300 B1 | 3/2001 | Maurizio | 165/80.3 |
| 6,244,331 B1 | 6/2001 | Budelman | 165/80.3 |
| 6,330,908 B1 * | 12/2001 | Lee et al. | 165/185 |
| 6,360,816 B1 * | 3/2002 | Wagner | 165/122 |
| 6,374,490 B1 | 4/2002 | Miyahara | 29/890.03 |
| 6,411,510 B2 | 6/2002 | Sasa et al. | 361/697 |
| 6,419,007 B1 | 7/2002 | Ogawara et al. | 165/80.3 |
| 6,487,076 B1 * | 11/2002 | Wang | 361/697 |
| 6,525,939 B2 * | 2/2003 | Liang et al. | 361/697 |
| 6,535,385 B2 | 3/2003 | Lee | |
| 6,552,902 B2 * | 4/2003 | Cho et al. | 361/704 |
| 6,561,261 B2 * | 5/2003 | Wagner | 165/80.3 |
| 6,633,484 B1 | 10/2003 | Lee et al. | |
| 6,640,882 B2 * | 11/2003 | Dowdy et al. | 165/80.3 |
| 6,640,883 B2 * | 11/2003 | Chen | 165/80.3 |
| 6,657,862 B2 * | 12/2003 | Crocker et al. | 361/697 |
| 6,666,261 B2 * | 12/2003 | Yang et al. | 165/80.4 |
| 6,671,172 B2 | 12/2003 | Carter et al. | |
| 6,681,842 B2 * | 1/2004 | Wagner | 165/80.3 |
| 6,688,379 B2 * | 2/2004 | Huang et al. | 165/121 |
| 6,691,770 B2 * | 2/2004 | Wagner | 165/104.33 |
| 6,698,499 B1 * | 3/2004 | Wagner et al. | 165/80.3 |
| 6,714,415 B1 * | 3/2004 | Shah | 361/704 |
| 6,725,906 B2 * | 4/2004 | Lin et al. | 361/695 |
| 6,845,010 B2 | 1/2005 | Lee | |
| 6,851,467 B1 * | 2/2005 | Bamford et al. | 165/80.3 |
| 6,879,487 B2 * | 4/2005 | Simon et al. | 361/697 |
| 6,886,624 B2 * | 5/2005 | Zobel et al. | 165/41 |
| 6,937,473 B2 * | 8/2005 | Cheng et al. | 361/704 |
| 7,055,578 B2 * | 6/2006 | Ku et al. | 165/80.3 |
| 7,059,388 B2 * | 6/2006 | Chang | 165/80.3 |
| 7,061,758 B2 * | 6/2006 | Liu et al. | 361/695 |
| 7,113,403 B2 * | 9/2006 | Kuo et al. | 361/697 |
| 7,117,932 B2 * | 10/2006 | Ku et al. | 165/121 |
| 7,120,020 B2 | 10/2006 | Carter et al. | |
| 7,123,483 B2 * | 10/2006 | Otsuki et al. | 361/710 |
| 2001/0014011 A1 | 8/2001 | Sasa et al. | 361/704 |
| 2002/0017378 A1 | 2/2002 | Hu | 165/80.3 |
| 2002/0018336 A1 | 2/2002 | Liang | 361/697 |
| 2002/0046826 A1 | 4/2002 | Kao | 165/104.33 |
| 2004/0045702 A1 * | 3/2004 | Barsun | 165/185 |
| 2005/0061480 A1 * | 3/2005 | Carter et al. | 165/80.3 |
| 2005/0211416 A1 * | 9/2005 | Kawabata et al. | 165/80.3 |
| 2005/0280992 A1 | 12/2005 | Carter et al. | |
| 2006/0126303 A1 * | 6/2006 | Wang et al. | 361/704 |
| 2006/0131000 A1 * | 6/2006 | Liu | 165/80.3 |
| 2006/0176668 A1 * | 8/2006 | Otsuki et al. | 361/697 |
| 2006/0213642 A1 * | 9/2006 | Lai | 165/80.3 |
| 2006/0219386 A1 * | 10/2006 | Hsia | 165/80.3 |

FOREIGN PATENT DOCUMENTS

| | | |
|---|---|---|
| EP | 1081760 | 3/2001 |
| EP | 1081760 A2 | 3/2001 |
| JP | 04-294570 | 10/1992 |
| JP | 2001/102504 | 4/2001 |
| WO | WO-0241396 A2 | 5/2002 |

OTHER PUBLICATIONS

Schnurer, G, "Coole Typen Neue CPU-Kuehler Von Madex Und Titan", *CT Magazin Fuer Computer Technik.*, Verlag Heinz Heise GMBH,Hannover,DE NR.11,82-83.

Wagner, G R., "Optimization of the Arcticooler for Lowest Thermal Resistance in a minimum Volume", *ITHERM 2000. 7TH Intersociety Conference on Thermal and Thermomrchanical Phenomena in Electronic Systems*, Intersociety Conference on Thermal and Thermomechanical Phenomena in Electronic Systems, NY, IEEE, US ISBN: 0-7803-5913-5,(May 2000).

\* cited by examiner

ELECTRONIC ASSEMBLIES WITH HIGH CAPACITY HEAT SINKS AND METHODS OF MANUFACTURE

DIVISIONAL APPLICATION

The present application is a divisional of application U.S. Ser. No. 09/950,100, filed on Sep. 10, 2001, now issued as U.S. Pat. No. 6,671,172.

RELATED APPLICATIONS

The present application is related to the following applications which are assigned to the same assignee as the present application:

Ser. No. 09/716,510, entitled "A High-Performance Fin Configuration For Air-Cooled Heat Dissipation Device," now issued as U.S. Pat. No. 6,633,484;

Ser. No. 09/766,757, entitled "High-Performance Heat Sink Configurations For Use In High Density Packaging Applications," now issued as U.S. Pat. No. 6,535,385;

Ser. No. 09/800,120, entitled "Radial Folded Fin Heat Sink";

Ser. No. 09/860,978 entitled "High Performance Air Cooled Heat Sinks Used In High Density Packaging Applications," now issued as U.S. Pat. No. 6,479,895;

Ser. No. 10/047,101, entitled "Heat Sinks and Methods of Formation", now abandoned;

Ser. No. 09/950,898, entitled "A Manufacturing Process for a Radial Fin Heat Sink", now issued as U.S. Pat. No. 6,705,144; and Ser. No. 09/950,101, entitled "Radial Folded Fin Heat Sinks and Methods of Making and Using Same", now issued as U.S. Pat. No. 6,657,862.

TECHNICAL FIELD

The inventive subject matter relates generally to electronics packaging and, more particularly, to several embodiments of an electronic assembly that includes a electronic component and a high capacity heat sink, and to manufacturing methods related thereto.

BACKGROUND INFORMATION

Electronic components, such as integrated circuits (ICs), are typically assembled into packages by physically and electrically coupling them to a substrate, such as a printed circuit board (PCB), to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, Internet appliance, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs on substrates, where each new generation of packaging must provide increased performance, particularly in terms of an increased number of components and higher clock frequencies, while generally being smaller or more compact in size.

As the internal circuitry of ICs, such as processors, operates at higher and higher clock frequencies, and as ICs operate at higher and higher power levels, the amount of heat generated by such ICs can increase their operating temperature to unacceptable levels, degrading their performance or even causing catastrophic failure. Thus it becomes increasingly important to adequately dissipate heat from IC environments, including IC packages.

For this reason, electronic equipment often contains heat dissipation equipment to cool high-performance ICs. One known type of heat dissipation equipment includes an impinging fan mounted atop a heat sink. The heat sink comprises a plurality of radial fins or rods formed of a heat-conductive material such as copper or aluminum formed around a core. The bottom surface of the core is in thermal contact with the IC to conduct heat from the IC to ambient air. The fan moves air over the fins or rods to enhance the cooling capacity of the heat dissipation equipment. However, with high-performance ICs consuming ever greater amounts of power and accordingly producing greater amounts of heat, heat dissipation equipment must have higher heat dissipation capability than that heretofore obtained.

In order to offer higher capacity heat transfer, new heat dissipation equipment must be more efficient. It is difficult for air-cooled heat sinks to grow in size, because equipment manufacturers are under tremendous competitive pressure to maintain or diminish the size of their equipment packages, all the while filling them with more and more components. Thus, competitive heat dissipation equipment must be relatively compact in size and must perform at levels sufficient to prevent high-performance components from exceeding their operational heat specifications.

For the reasons stated above, and for other reasons stated below which will become apparent to those skilled in the art upon reading and understanding the present specification, there is a significant need in the art for apparatus and methods for packaging high-performance electronic components in an electronic assembly that minimize heat dissipation problems.

DETAILED DESCRIPTION

In the following detailed description of some exemplary embodiments of the inventive subject matter, reference is made to the accompanying drawings which form a part hereof, and in which is shown by way of illustration, but not of limitation, some specific embodiments in which the inventive subject matter may be practiced, including a preferred embodiment. These embodiments are described in sufficient detail to enable those skilled in the art to understand and practice them, and it is to be understood that other embodiments may be utilized and that structural, mechanical, compositional, and procedural changes may be made without departing from the spirit and scope of the inventive subject matter. The following detailed description is, therefore, not to be taken in a limiting sense, and the scope of embodiments of the inventive subject matter is defined only by the appended claims. Such embodiments of the inventive subject matter may be referred to, individually and/or collectively, herein by the term "invention" merely for convenience and without intending to voluntarily limit the scope of this application to any single invention or inventive concept if more than one is in fact disclosed.

The inventive subject matter provides a solution to thermal dissipation problems that are associated with prior art packaging of integrated circuits that have high circuit density and that operate at high clock speeds and high power levels, by employing a high capacity heat sink. Various embodiments are illustrated and described herein.

In one embodiment, the heat sink comprises a thermally conductive core. The core has a number of thermally conductive fins projecting from it in a substantially radial fashion. The core can have a central cavity into which a thermally conductive material is inserted. The heat sink fins can be formed in various shapes. In one embodiment, the fins are curved. In another embodiment, the fins are bent. In yet another embodiment, the fins are curved and bent.

In one embodiment, the heat sink can be used in an electronic assembly having an impinging fan, e.g. an axial flow fan, directing air onto an upper face of the heat sink. The lower face of the heat sink is in thermal contact with a heat-generating electronic component such as a high performance IC. The heat sink is structured to capture air from the fan and to direct the air to optimize heat transfer from the heat sink.

Various methods of fabricating heat sinks and electronic assemblies are also described.

Figure 1:
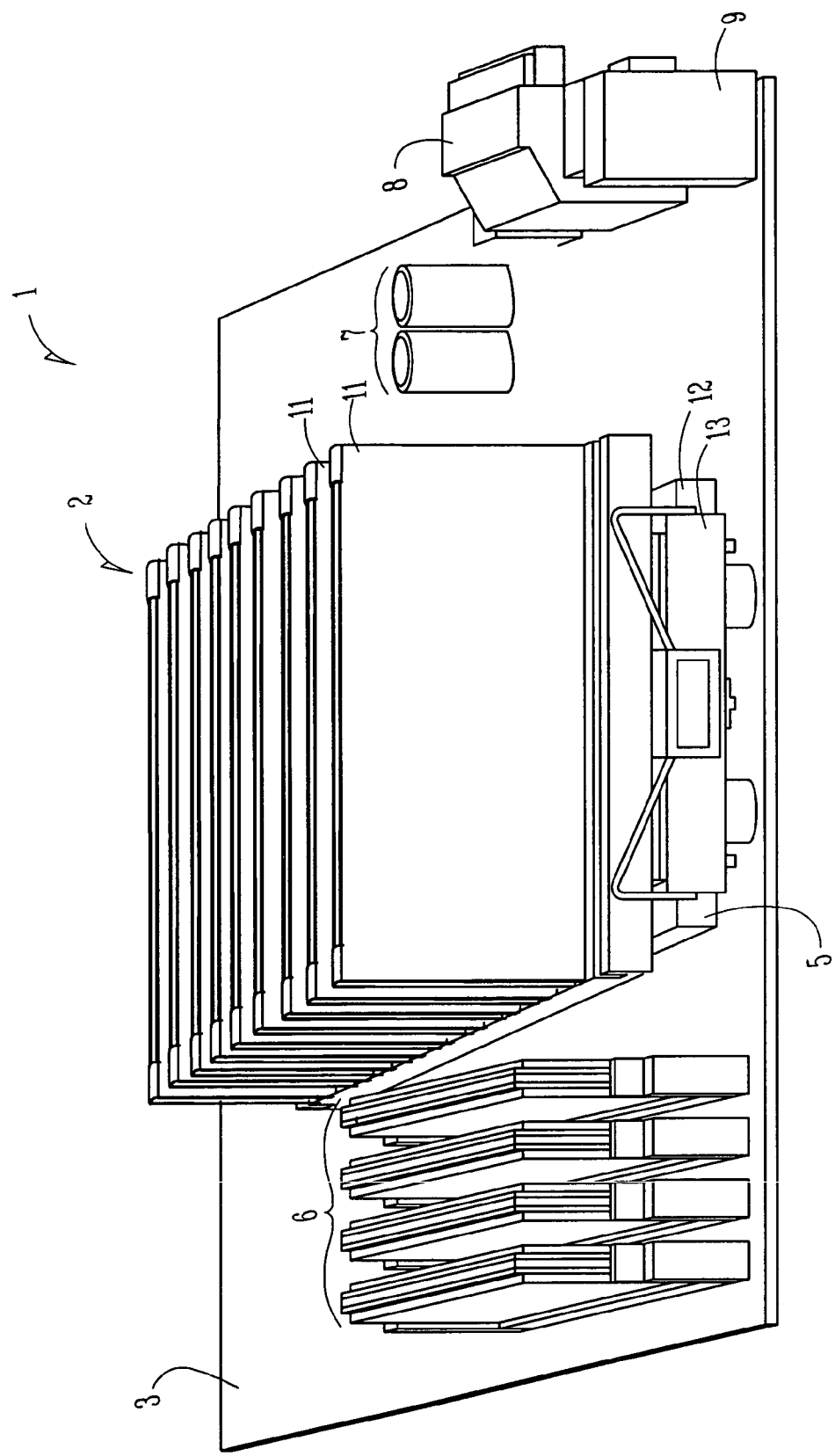
FIG. 1 is a perspective view of a prior art electronic assembly including a heat sink attached to an IC package.

FIG. 1 is a perspective view of a prior art electronic assembly 1 including a heat sink 2 attached to an IC package 5. Electronic assembly 1 comprises a plurality of electronic components 5–9 mounted upon a printed circuit board (PCB) 3. Heat sink 2 comprises a relatively thick, flat base plate 12 and an array of fins 11 extending to the edge of and substantially perpendicular to the base plate 12. Although the fins 11 shown in FIG. 1 are folded fins, other prior art heat sinks do not have folded fins. For example, it is known in the prior art to use brazed, machined, or extruded solid fins. Base plate 12 is clamped to IC package 5 through an attachment device 13. Base plate 12 is often formed of solid copper, and it contributes a significant amount of cost and mass to electronic assembly 1.

While the sizes of packaged, high performance ICs are decreasing, the amount of heat generated by these components per unit volume is increasing. Increasing the heat dissipation capabilities of the prior art heat sink 2 would require enlarging the surface area of the base plate 12 and/or the array of fins 11. This in turn would result in consuming more PCB real estate, which is generally not a viable option in an environment where system packaging densities are increasing with each successive, higher performance, product generation.

Prior art heat sink 2 illustrated in FIG. 1 can be used in conjunction with an axial flow fan (not shown in FIG. 1) to increase heat dissipation from the array of fins 11. An axial flow fan has a spinning impeller that is generally shaped like an airfoil. One component of the air flow emanating from an axial flow fan moves parallel to the axis about which the impeller rotates, and this "axial component" is directed normal to the array of fins 11 of the heat sink 2, i.e.

perpendicular to the PCB 1. (Refer to axial component 132 in FIG. 14.) Another component of the air flow from an axial flow fan is tangential to the impeller's direction of rotation. This "tangential component" results in air swirling about the impeller's axis of rotation. (Refer to tangential component 130 in FIG. 14.) The ratio of air being moved by the axial component versus the tangential component varies with the particular fan blade geometry. For example, low angles of attack in the fan blade generally result in a higher ratio of axial flow, while high angles of attack generally result in a higher ratio of tangential flow. In some axial flow fans, the ratio is 1:1.

When an axial flow fan is mounted facing downward on prior art heat sink 2, its axial component of air flow provides substantially all of the cooling effect, because very little of the tangential component of air flow is captured by the straight vertical fins 11.

Figure 2:
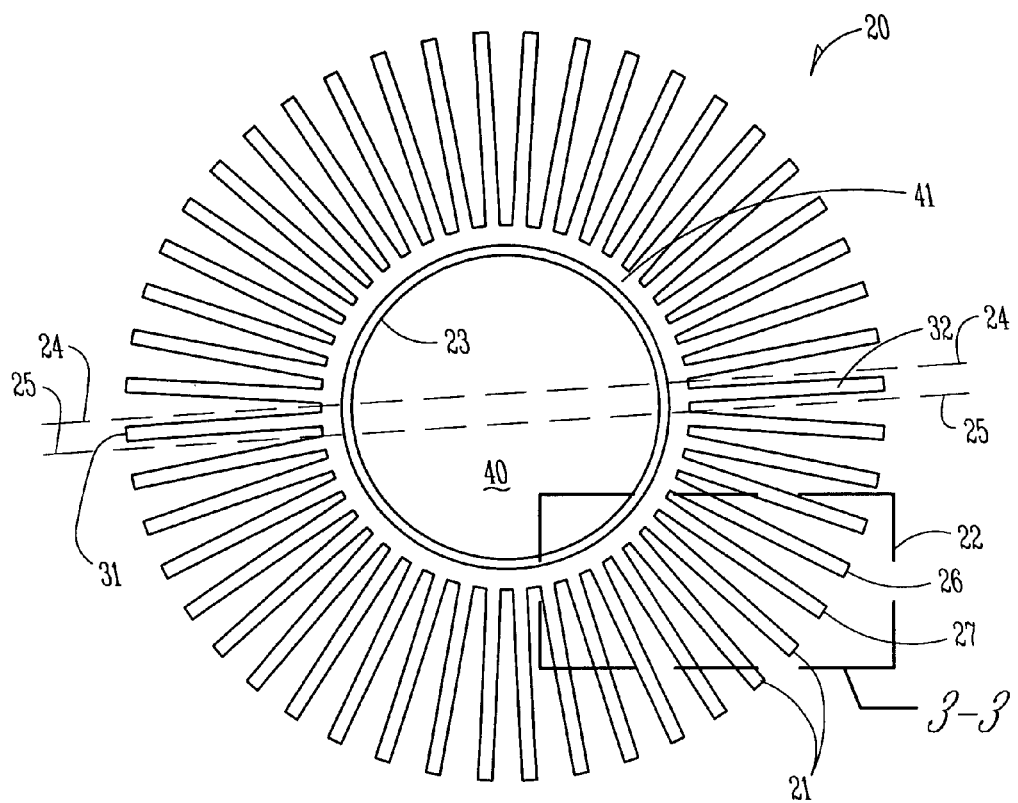
FIG. 2 is a top view of a prior art radial fin heat sink.

FIG. 2 is a top view of a prior art radial fin heat sink 20. Heat sink 20 is referred to as a "radial fin heat sink", because its fins 21 emanate radially from a central core 41. Fins 21 are substantially straight, and the base of each fin 21 is attached to core 41 parallel to a central axis 42 (refer to FIG. 4). Referring back to FIG. 2, core 41 can have a central cavity 23, and a thermal plug 40 of thermally conductive material can reside within cavity 23 to enhance thermal dissipation.

Figure 3:
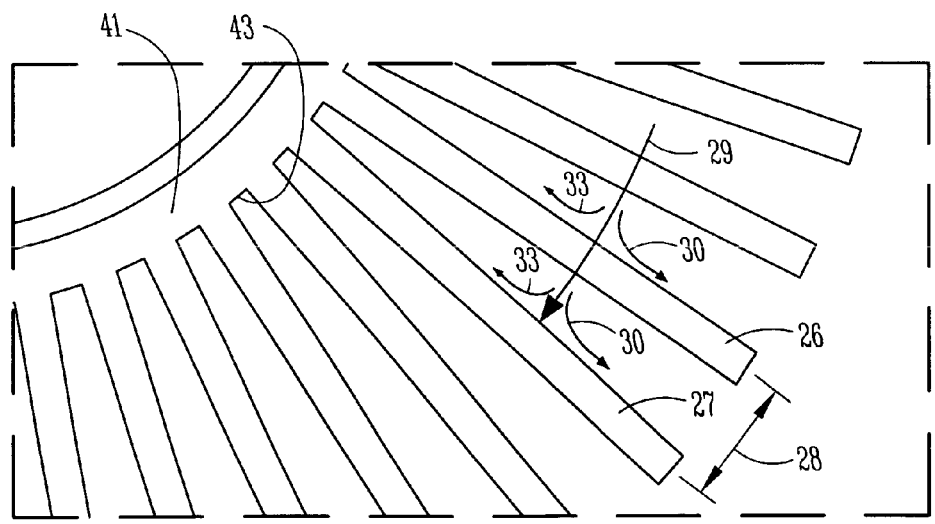
FIG. 3 is a top view of the portion within dashed rectangle 22 of FIG. 2, showing an air flow pattern within fins of a prior art radial fin heat sink.

FIG. 3 is a top view of the portion within dashed rectangle 22 of FIG. 2, showing an air flow pattern within fins of the prior art radial fin heat sink 20 shown in FIG. 2. In FIG. 3, a tangential air flow component 29 from an axial flow fan (not shown) impinges upon fins 26 and 27.

Before discussing tangential air flow component 29, it should be first noted that fins 26 and 27 are substantially perpendicular to core 41, and that fins 26 and 27 diverge considerably as they emanate from core 41. The radius 43 at the base of fins 26 and 27 is substantially smaller than the fin tip distance 28 at the tips of fins 26 and 27.

Tangential air flow component 29 impinges against the fins of prior art radial fin heat sink 20, such as fins 26 and 27. A major portion 30 of tangential air flow component 29 moves outwardly towards the tips of fins 26 and 27. A smaller portion 33 of tangential air flow component 29 moves inwardly towards the bases of fins 26 and 27.

Due to the diverging geometry of fins 26 and 27, air flow from the tangential component 29, as well as air flow from the axial component (not seen in FIG. 3), moves towards the fin tips to escape the region between adjacent fins 26 and 27, and thus little air flow reaches the hottest part of fins 26 and 27 near core 41. This results in inefficient thermal dissipation. Consequently, a more powerful and noisier fan must be substituted, or the electronic component will not be sufficiently cooled to avoid performance degradation or catastrophic failure.

Figure 4:
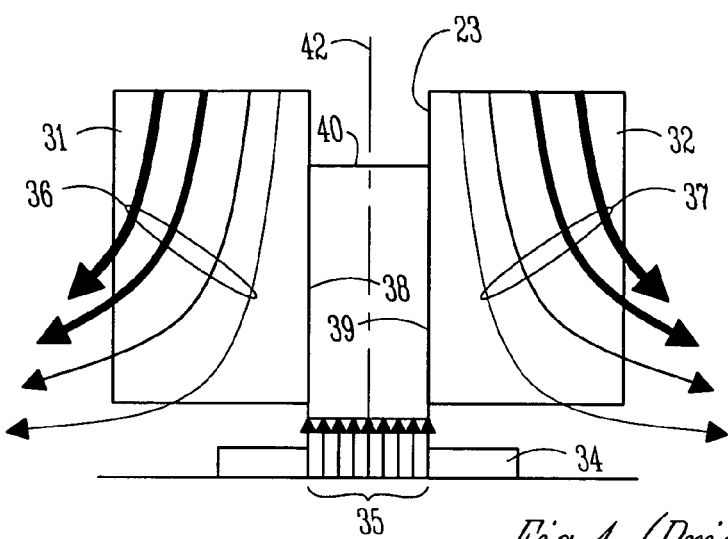
FIG. 4 is a side view of a section, taken between dashed line segments 24 and 25 of FIG. 2, of a prior art radial fin heat sink positioned upon an IC package.

FIG. 4 is a side view of a section, taken between dashed line segments 24 and 25 of FIG. 2, of a prior art radial fin heat sink 20 positioned upon an IC package 34. Fins 31 and 32 are on opposite sides of heat sink 20. The lower surface of thermal plug 40 is in thermal contact with the upper surface of a heat-producing IC package 34. Heat, represented by arrows 35, is transferred from IC package 34 into thermal plug 40. From thermal plug 40, heat is transferred through sidewall 38 of cavity 23 to fin 31 (the heat sink core has been omitted to simplify this illustration), and through sidewall 39 of cavity 23 to fin 32. The hottest part of fins 31 and 32 is nearest the thermal plug 40.

A group 36 of air flow vectors is schematically shown to represent an axial air flow component produced by an axial flow fan (not shown) downward between adjacent fins, including fin 31, of prior art radial fin heat sink 20. It will be seen that little if any air flow moves against the hottest part of fin 31 nearest thermal plug 40.

Likewise, another group 37 of air flow vectors represents an axial air flow component produced by the axial flow fan (not shown) downward between adjacent fins, including fin 32. Again, little if any air flow moves against the hottest part of fin 32 nearest thermal plug 40.

In addition, it is not readily apparent from FIGS. 3 and 4, but only an insubstantial amount of air flow from the tangential component produced by a typical axial flow fan is captured by the prior art radial fin heat sink. This is illustrated further below regarding FIG. 18.

It should be apparent that what is needed is a heat sink structure that significantly increases the amount of air impinging upon the hottest part of the heat sink, and that significantly increases the volume and velocity of air moving through the heat sink fins, including significantly increasing the amount of the tangential component of an axial flow fan that is captured by the heat sink.

Figure 5:
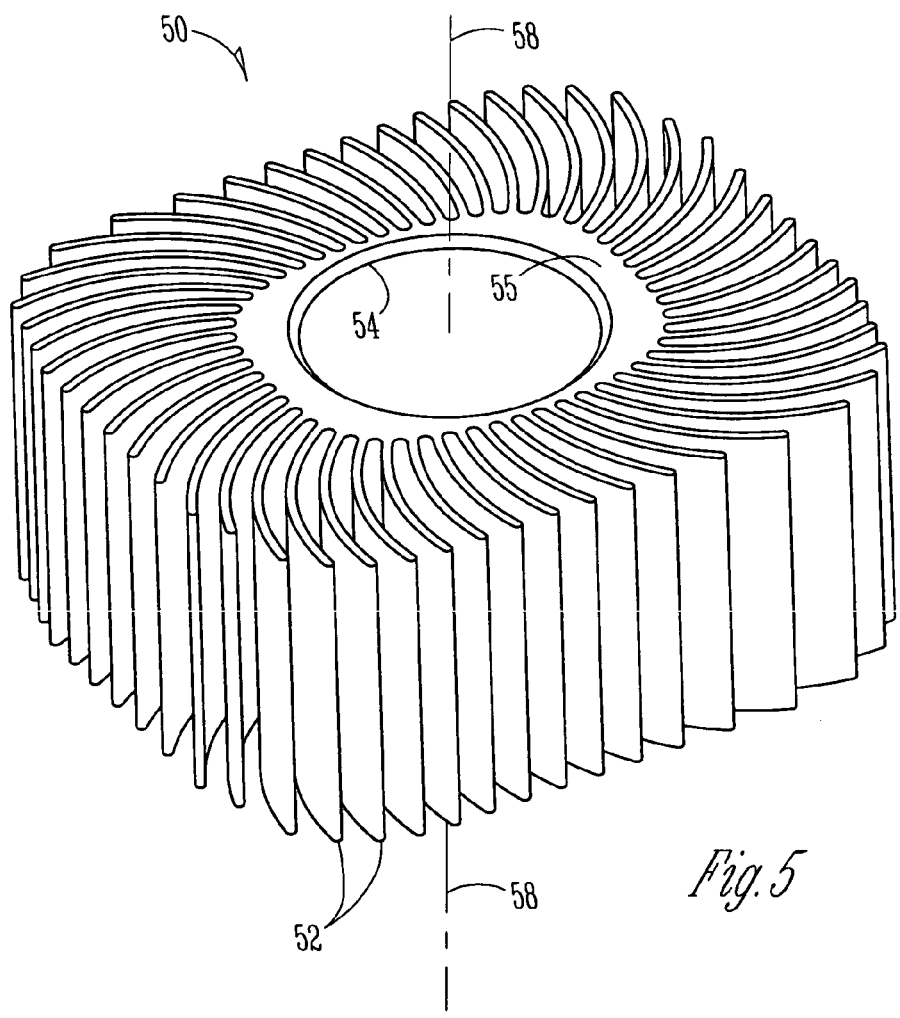
FIG. 5 illustrates a perspective view of a curved fin heat sink, in accordance with an embodiment of the inventive subject matter.

FIG. 5 illustrates a perspective view of a curved fin heat sink 50, in accordance with an embodiment of the inventive subject matter. Curved fin heat sink 50 comprises a plurality of cooling fins 52 arranged about a core 55. Fins 52 are formed of a material having high thermal conductivity such as a thermally conductive metal. In one embodiment, fins 52 are formed of aluminum; however, they could also be formed of copper or any other suitable thermally conductive metal or metal alloy.

Core 55 has a central axis 58. Core 55 can optionally have a central cavity 54 for insertion of a thermal plug (not shown). Each fin 52 has a base and a tip. The base of each fin 52 is coupled to core 55 substantially parallel to central axis 58. It will be seen from FIG. 5 that the tips of fins 52 define the periphery of a face to face the component (e.g. IC package 64, FIG. 7), and that the face comprises inter-fin openings in the form of spaces between individual fins 52. Each fin 52 is curved in the same relative direction. As will be seen from the description below, the fins 52 of curved fin heat sink 50 are shaped to capture the tangential component of air from an axial flow fan (not shown in FIG. 5). Fins 52 are also shaped to direct a relatively large volume and relatively high velocity of air flow to contact substantially the entire surface of each fin 52, including the hottest portion of each fin 52 adjacent the core 55.

Figure 6:
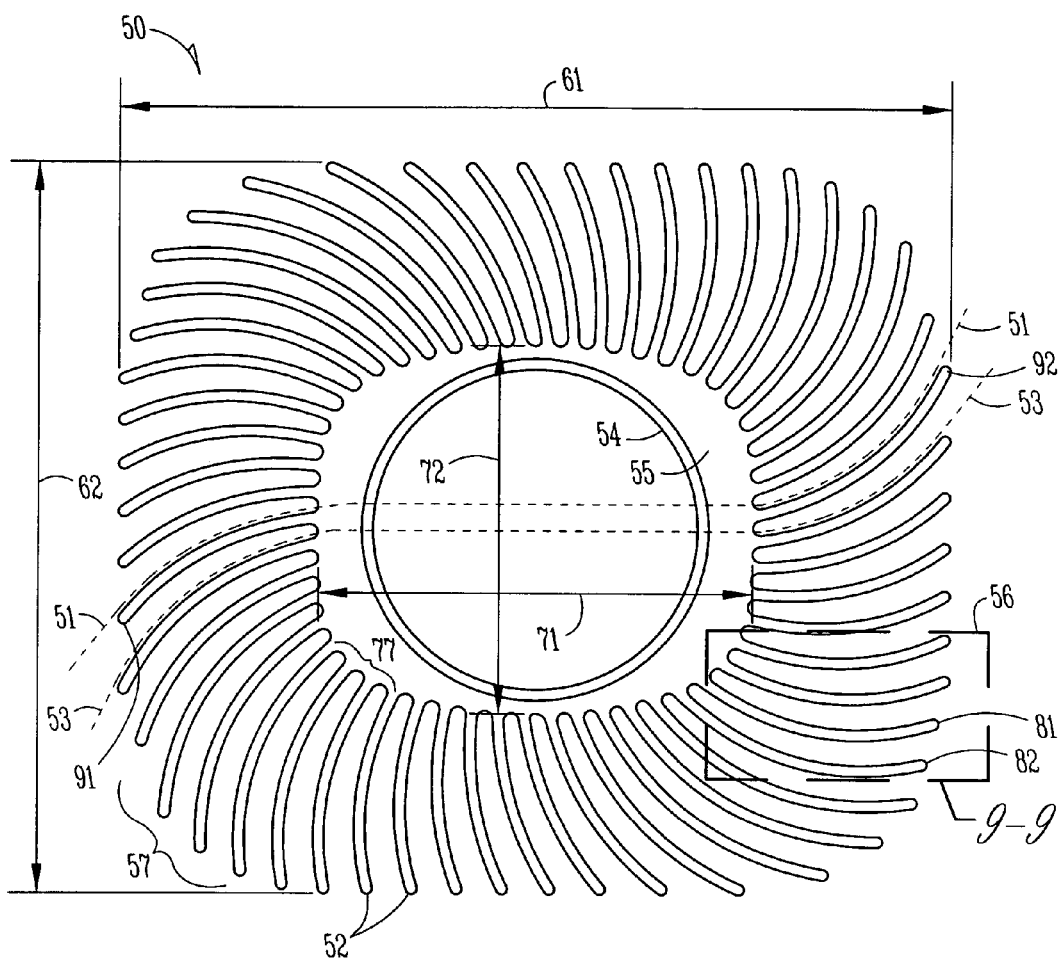
FIG. 6 illustrates a top view of the curved fin heat sink shown in FIG. 5.

FIG. 6 illustrates a top view of the curved fin heat sink 50 shown in FIG. 5. An explanation will now be given as to how curved fin heat sink 50 is shaped in order to maximize the number of cooling fins 52 for a desired "semi-rectangular" shape of curved fin heat sink 50 while maintaining a substantially uniform aspect ratio among all of cooling fins 52. "Semi-rectangular" is defined herein to mean a geometrical figure having four straight or slightly curved (either concave or convex) sides that meet at corners that are perpendicular, rounded, and/or otherwise different from perpendicular.

A semi-rectangular shape was chosen for one embodiment of curved fin heat sink 50, because that shape most closely matched the footprint of a high performance IC package on which curved fin heat sink 50 was mounted. A further constraint on the shape of curved fin heat sink 50, in this embodiment, was a "keep-out area" on the circuit board around the IC package, due to the necessity of mounting other components in the keep-out area and of minimizing the overall physical size of the circuit board.

The semi-rectangular shape of curved fin heat sink 50 can be seen in FIG. 6, in that curved fin heat sink 50 comprises two slightly convex-curved sides of length 61 and two slightly convex-curved ends of length 62. Each side meets a respective end at a rounded corner such as corner 57.

Fins 52 are fabricated, in one embodiment, through an extrusion process. By using an extrusion process, heat sinks can be made at a significant savings in manufacturing costs as compared with a process, for example, in which fins are machined from a heat sink core, or brazed or soldered onto a heat sink core. Using high volume manufacturing techniques, extrusions several feet long can be quickly formed and then cut into individual curved fin heat sinks, each having a plurality of curved fins and, optionally if desired, a central cavity to accommodate a thermal plug.

However, the extrusion process for curved fins is currently subject to several process constraints. One constraint is that for extruding aluminum, for example, the aspect ratio of a curved fin 52, i.e. the ratio of the length of a fin 52 to the average width of the gap between two adjacent fins 52, cannot exceed about 10:1 to 12:1. Another constraint is that the radius at the base of the fins cannot be less than about 1.0 to 1.2 millimeters.

Yet another constraint is to provide as many fins 52 as possible (subject to the above-mentioned radius constraint), with each fin 52 as long as possible (subject to the above-mentioned aspect ratio constraint), in order to provide as great a total heat dissipation surface as possible. In the situation where the heat sink is being used to cool an IC, the heat dissipation from the heat sink must be at least sufficient to maintain a junction temperature within the IC at or below a predetermined maximum value.

In view of the above-mentioned process constraints, the core 55 is shaped to substantially match the shape or footprint of curved fin heat sink 50, which in the embodiment shown in FIG. 6 is a semi-rectangular shape. Thus, core 55 comprises two slightly convex-curved sides of length 71 and two slightly convex-curved ends of length 72. Each side meets a respective end at a rounded corner such as corner 77. As a result, the aspect ratio of fins 52 can be maintained substantially uniform around the entire periphery of curved fin heat sink 50. Some variation in aspect ratio of fins 52 around the periphery of curved fin heat sink 50 is acceptable, so long as the maximum aspect ratio of approximately 10:1 to 12:1 is not exceeded for any fin 52. It will be understood that with advances in extrusion technology the upper end of the aspect ratio range can be expected to rise; however, the same principles of the disclosure will nonetheless be applicable to heats sinks extruded with more advanced extrusion technology.

Figure 7:
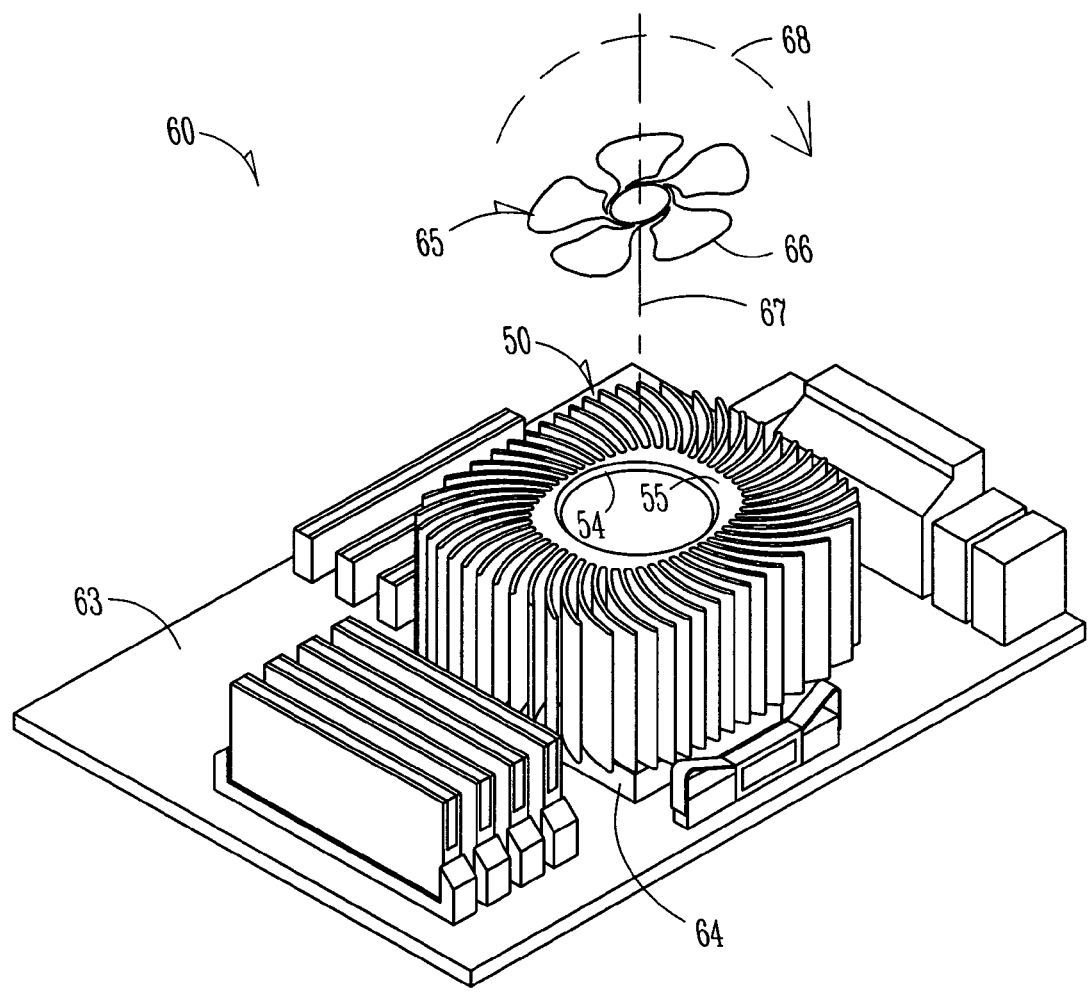
FIG. 7 illustrates a perspective view of an electronic assembly including a curved fin heat sink positioned upon an IC package, in accordance with an embodiment of the inventive subject matter.

FIG. 7 illustrates a perspective view of an electronic assembly 60 including a curved fin heat sink 50 positioned upon an IC package 64, in accordance with an embodiment of the inventive subject matter. IC package 64 is shown mounted upon a circuit board 63, which can be of similar or identical type to the prior art circuit board illustrated in FIG. 1; however, circuit board 63 can be of any type. The lower face of curved fin heat sink 50 is in thermal contact with IC package 64.

An axial flow fan 65 is shown schematically positioned over the upper face of curved fin heat sink 50. Fan 65 comprises a plurality of fan blades or impellers 66 that rotate, in the direction indicated by arrow 68, about an axis 67 that is substantially perpendicular to the upper face of curved fin heat sink 50.

Because heat sink 50 is considerably less expensive to fabricate, and has considerably less mass, than the prior art heat sink 2 illustrated in FIG. 1, electronic assembly 60 is more commercially desirable than the prior art electronic assembly 1 illustrated in FIG. 1

Figure 8:
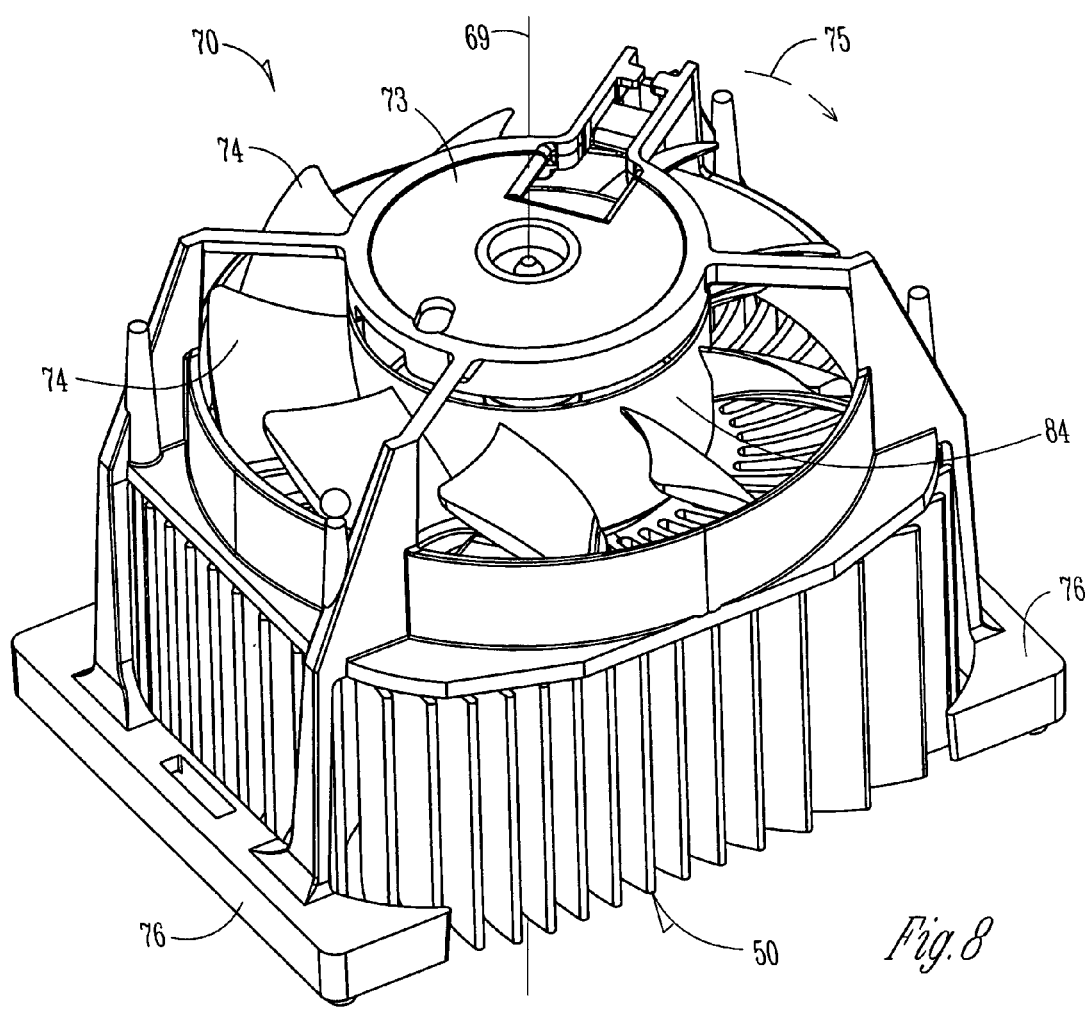
FIG. 8 illustrates a perspective view of a portion of an electronic assembly including an axial flow fan atop a curved fin heat sink, in accordance with an embodiment of the inventive subject matter.

FIG. 8 illustrates a perspective view of a portion of an electronic assembly including an axial flow fan 70 atop a curved fin heat sink 50, in accordance with an embodiment of the inventive subject matter. Fan 70 comprises a plurality of curved blades 74 disposed about an axis 69 that is substantially perpendicular to the upper face of curved fin heat sink 50. Blades 74 are attached to a hub 84 that is driven, in the direction of rotation indicated by arrow 75, by fan motor 73. A hold-down mechanism 76 is used to clamp fan 70 and curved fin heat sink 50 to the upper surface of a heat-producing IC (not shown) on a circuit board (not shown) underlying curved fin heat sink 50.

Figure 9:
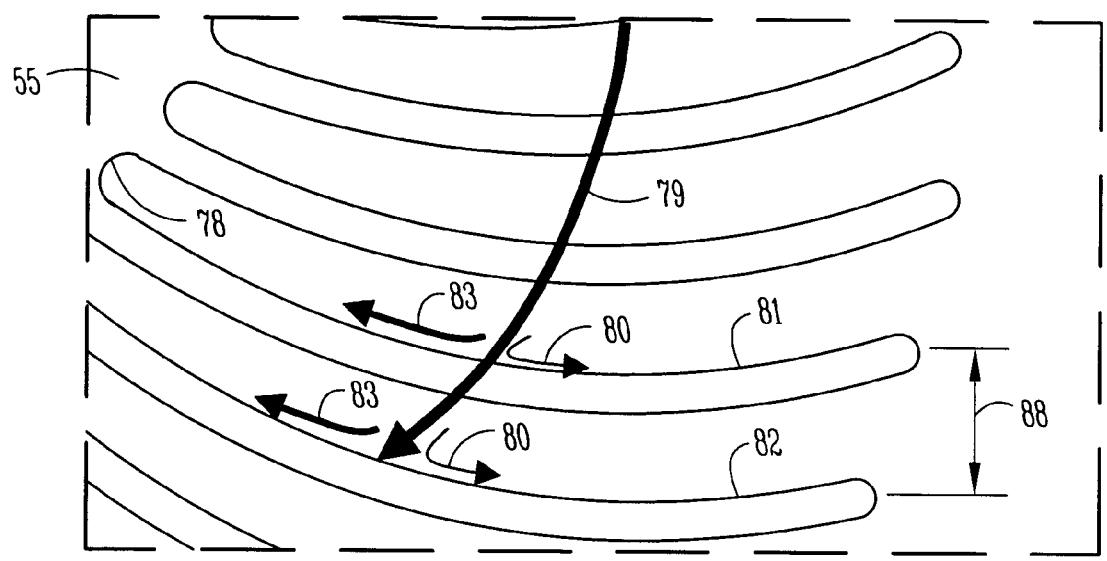
FIG. 9 illustrates a top view of the portion within dashed rectangle 56 of FIG. 6, showing an air flow pattern within fins of a curved fin heat sink, in accordance with an embodiment of the inventive subject matter.

FIG. 9 illustrates a top view of the portion within dashed rectangle 56 of FIG. 6, showing an air flow pattern within fins 81 and 82 of curved fin heat sink 50, in accordance with an embodiment of the inventive subject matter. In FIG. 9, a tangential air flow component 79 from an axial flow fan (not shown) impinges upon fins 81 and 82. Each fin, such as fin 81 or 82, is curved towards, or faces, counter to the direction of rotation 75 of fan blades 74 (FIG. 8).

Before discussing tangential air flow component 79, it should be first noted that the base regions of fins 81 and 82 are substantially perpendicular to core 55. From their bases, fins 81 and 82 curve substantially away from the perpendicular. However, fins 81 and 82 diverge only slightly as they emanate from core 55. The radius 78 at the base of fins 81 and 82 is only slightly smaller than the fin tip distance 88 at the tips of fins 81 and 82. This geometry provides significantly improved air flow between fins 81 and 82. It provides a more constricted path towards the tips of the fins, thus retaining more of the air flow between the fins, where it can dissipate heat from the fins.

Tangential air flow component 79 impinges against the fins of curved fin heat sink 50, such as fins 81 and 82. A relatively small portion 80 of tangential air flow component 79 moves outwardly towards the tips of fins 81 and 82. A significantly larger portion 83 of tangential air flow component 79 moves inwardly towards the bases of fins 81 and 82. Thus, significantly more air flow is directed towards the hottest part of heat sink, i.e. core 55 and particularly the base portions of fins 81 and 82 near core 55. Because air flow is directed inwardly toward the core, in some embodiments a fan shroud, which would block air flow from exiting out the tips of the fins, may be dispensed with, thus offering significant cost, mass, and reliability advantages.

Figure 10:
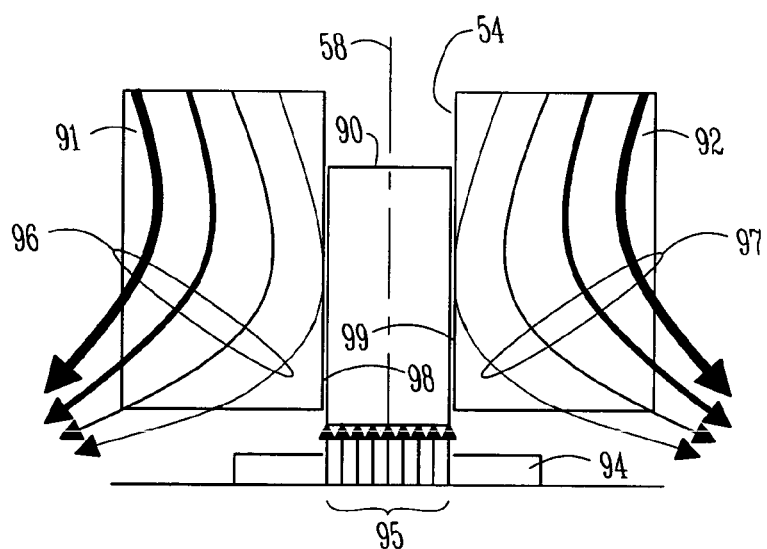
FIG. 10 illustrates a side view of a section of the curved fin heat sink shown in FIG. 6, taken between dashed line segments 51 and 53.

FIG. 10 illustrates a side view of a section of the curved fin heat sink 50 shown in FIG. 6, taken between dashed line segments 51 and 53. Fins 91 and 92 are on opposite sides of curved fin heat sink 50. The lower surface of thermal plug 90 is in thermal contact with the upper surface of a heat-producing IC package 94. Heat, represented by arrows 95, is transferred from IC package 94 into thermal plug 90. From thermal plug 90, heat is transferred through sidewall 98 of cavity 54 to fin 91 (the heat sink core has been omitted to simplify this illustration), and through sidewall 99 of cavity 54 to fin 92. The hottest part of fins 91 and 92 is nearest the thermal plug 90.

A group 96 of air flow vectors is schematically shown to represent an air flow component produced by an axial flow fan (not shown) downward between adjacent fins, including fin 91, of curved fin heat sink 50 (FIG. 6). Still referring to FIG. 10, it will be seen that substantially more air flow moves against the hottest part of fin 91 nearest thermal plug 90 than in the prior art radial fin heat sink 20, as was discussed earlier regarding FIG. 4. The increase in air flow is produced by the curved fin geometry, which not only curves the fins to capture both the normal and tangential components of the air flow from the axial flow fan, but which also has an inter-fin space of near uniform width to allow air to move down between the fins at a higher volume and higher speed than if the fins widened towards their tips, as in the prior art heat sink 20 shown in FIG. 2.

Still referring to FIG. 10, another group 97 of air flow vectors represents an air flow component produced by the axial flow fan (not shown) downward between adjacent fins, including fin 92. Again, substantially more air flow moves against the hottest part of fin 92 nearest thermal plug 90.

In addition, although it is not readily apparent from FIGS. 9 and 10, a substantial amount of air flow from the tangential component produced by a typical axial flow fan is captured by the fins of curved fin heat sink 50 (FIG. 6). This again is achieved by the curved fin geometry that curves the fins towards the tangential component of air flow.

Thus, the curved fin heat sink 50 (FIG. 6) significantly increases the amount of air impinging upon the hottest part of the curved fin heat sink 50, and it significantly increases the volume and velocity of air moving through the curved fin heat sink 50, including significantly increasing the amount of the tangential component of an axial flow fan that is captured by the curved fin heat sink 50.

In addition, an axial flow fan used in conjunction with curved fin heat sink 50 can have a relatively low rotational speed, thus keeping fan noise to a minimum, while nonetheless producing sufficient air flow to dissipate heat from a heat-generating component in an electronic assembly.

Figure 11:
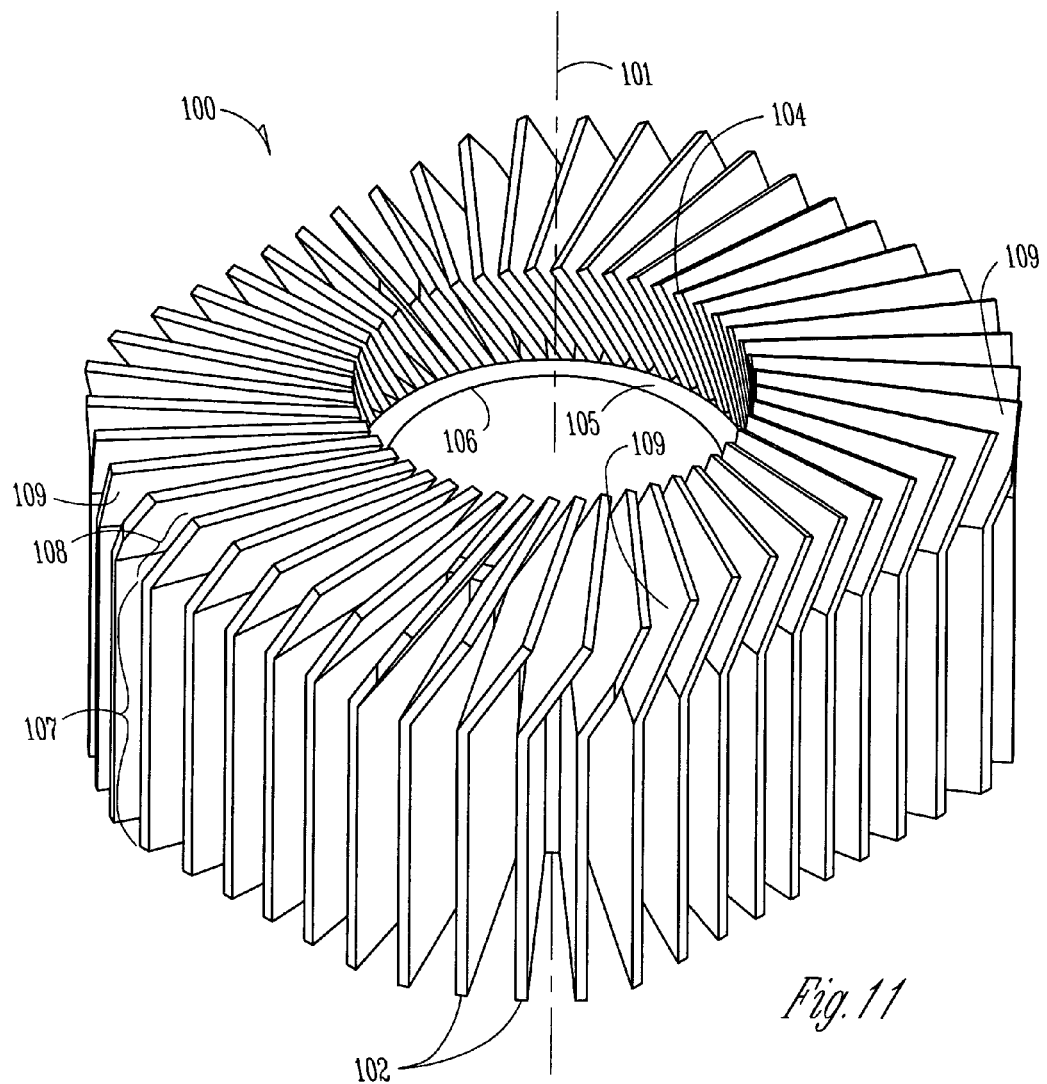
FIG. 11 illustrates a perspective view of a bent fin heat sink, in accordance with an embodiment of the inventive subject matter.

FIG. 11 illustrates a perspective view of a bent fin heat sink 100, in accordance with an embodiment of the inventive subject matter. Bent fin heat sink 100 comprises a plurality of cooling fins 102 arranged about a core 105. Fins 102 are formed of a thermally conductive metal. In one embodiment, fins 102 are formed of aluminum; however, they could also be formed of copper or any other suitable thermally conductive metal or metal alloy.

Core 105 has a central axis 101. Core 105 can optionally have a central cavity 106 for insertion of a thermal plug (not shown). Each fin 102 has a base and a tip. The base of each fin 102 is coupled to core 105 substantially parallel to central axis 101.

Each fin 102 comprises a vertical portion 107 and an angled portion 108. The angled portion 108 of each fin 102 is bent in the same relative direction. As will be seen from the description below, the fins 102 of bent fin heat sink 100 are shaped to capture the tangential component of air from an axial flow fan (not shown in FIG. 11). They are also shaped to direct a relatively large and relatively high velocity air flow to contact substantially the entire surface of each fin 102, including the hottest portion of each fin 102 adjacent the core 105.

According to one embodiment of a bent fin heat sink 100, after forming (e.g. by extrusion) a plurality of straight unbent fins emanating radially from core 105, the upper portion of the heat sink 100 is counterbored to produce a counterbore 104, in which part of the base of each fin 102 is sheared from core 105 in the vicinity only of angled portion 108. This allows angled portion 108 of each fin 102 to be bent in a subsequent operation.

In one embodiment, the angle that the angled portion 108 of each fin makes with the vertical portion 107 is approximately 150 degrees. In other embodiments, different angles could be used, depending upon the air flow characteristics of the particular axial flow fan being used in conjunction with the bent fin heat sink.

Instead of counterboring the upper portion of heat sink 100, a hole saw or other tool could be utilized to make a groove in the upper portion of heat sink 100 of sufficient depth to enable the angled portion 108 of each fin 102 to be bent.

It will be noted that for certain fins in the "corner" regions of bent fin heat sink 100, their upper tips 109 are slightly clipped to fit into a desired "semi-rectangular" (as earlier defined) footprint. However, in other embodiments, such clipping could be omitted.

Figure 12:
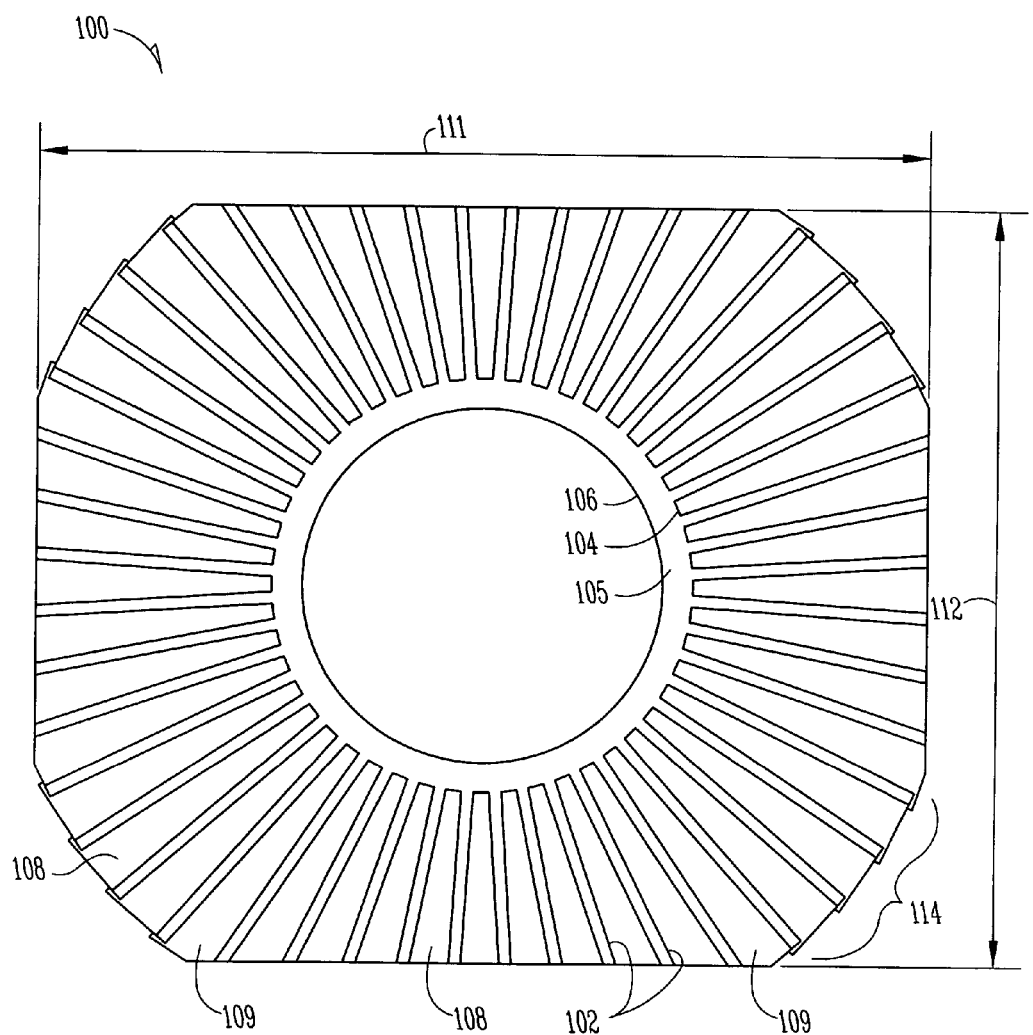
FIG. 12 illustrates a top view of a bent fin heat sink, in accordance with an embodiment of the inventive subject matter.

FIG. 12 illustrates a top view of a bent fin heat sink 100, in accordance with an embodiment of the inventive subject matter. Bent fin heat sink 100 is shaped in order to maximize the number of cooling fins 102 for a desired "semi-rectangular" shape of curved fin heat sink 100.

The semi-rectangular shape of curved fin heat sink 100 can be seen in FIG. 12, in that curved fin heat sink 100 comprises two substantially straight sides of length 111 and two substantially straight ends of length 112. Each side meets a respective end at a rounded corner such as corner 114.

Fins 102 are fabricated, in one embodiment, through an extrusion process. The extrusion process for bent fins is currently subject to basically the same process constraints as for the curved fin heat sink described in FIG. 6, except that the aspect ratio of the fins 102 can be slightly greater than for curved fins, ranging up to approximately 14:1 to 16:1.

In view of the fact that the fabrication of the angled portions 108 of the fins 102 of bent fin heat sink 100 requires counterboring a counterbore 104, the shape of core 105 is maintained generally circular in the embodiment shown in FIG. 12. However, in another embodiment, the shape of core 105 could be semi-rectangular, as in the embodiment shown in FIG. 6.

The trimmed upper tips 109 of certain fins 102 near the corners of heat sink 100 can be seen in FIG. 12.

Figure 13:
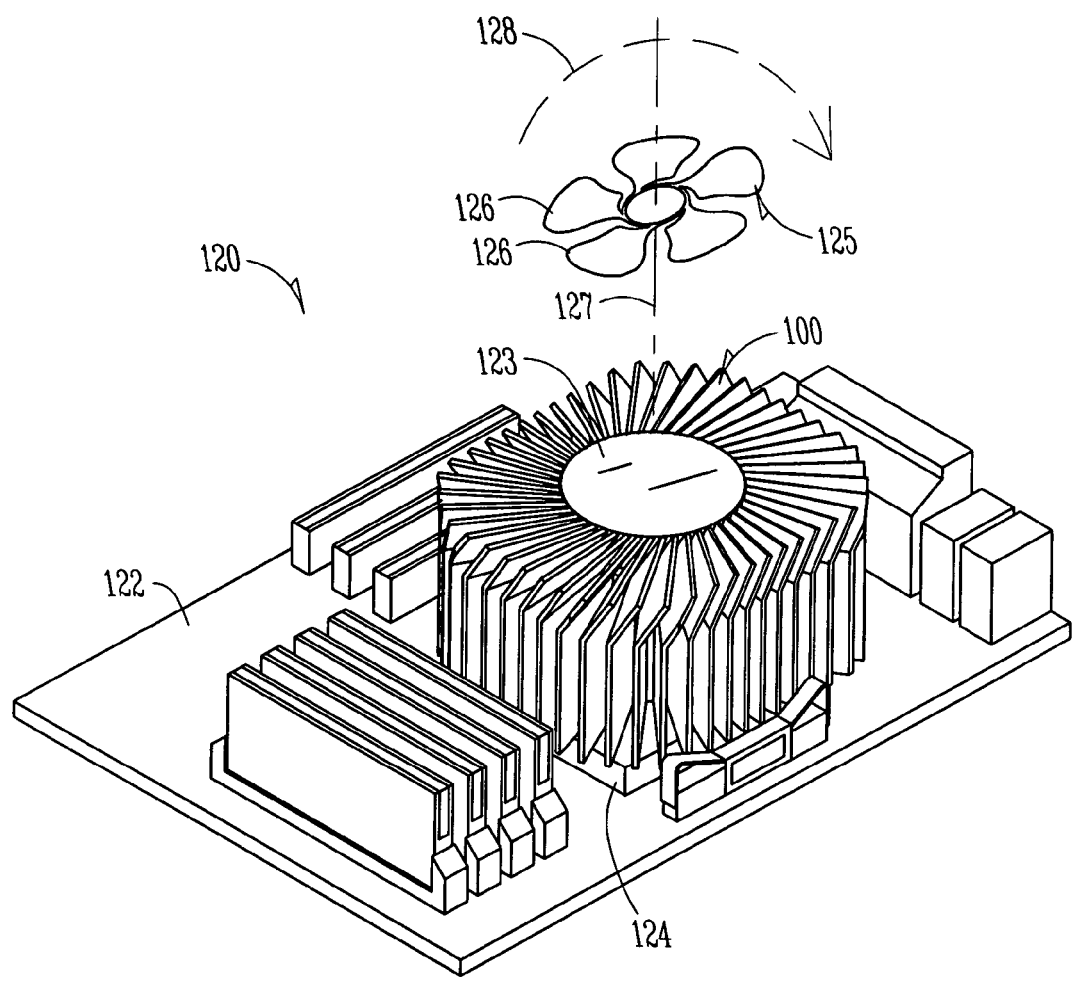
FIG. 13 illustrates a perspective view of an electronic assembly including a bent fin heat sink positioned upon an IC package, in accordance with an embodiment of the inventive subject matter.

FIG. 13 illustrates a perspective view of an electronic assembly 120 including a bent fin heat sink 100 positioned upon an IC 124 package, in accordance with an embodiment of the inventive subject matter.

IC package 124 is shown mounted upon a circuit board 122, which can be of similar or identical type to the prior art circuit board illustrated in FIG. 1; however, circuit board 122 can be of any type.

An axial flow fan 125 is shown schematically positioned over bent fin heat sink 100. Fan 125 comprises a plurality of fan blades or impellers 126 that rotate, in the direction indicated by arrow 128, about an axis 127 that is substantially perpendicular to the upper face of bent fin heat sink 100. Bent fin heat sink 100, in this embodiment, comprises a thermal plug 123. Thermal plug 123 can be formed of any suitable thermally conductive material. In one embodiment, thermal plug 123 is made of copper; however, aluminum or a copper or aluminum alloy could also be used.

Figure 14:
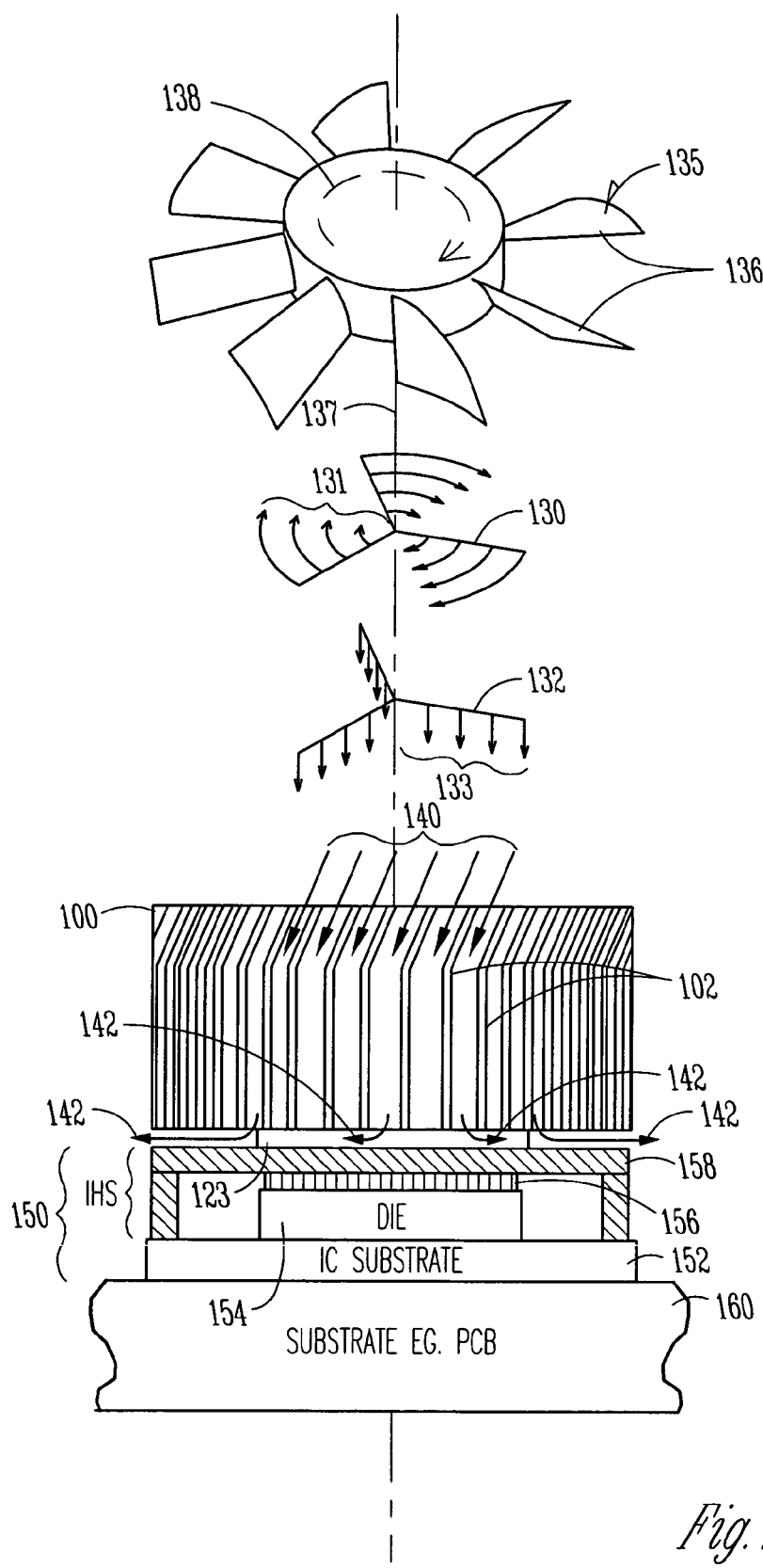
FIG. 14 illustrates a schematic view of a fan, including its tangential and axial air flow components, and a side view of a bent fin heat sink as positioned upon a sectioned IC package on a substrate, in accordance with an embodiment of the inventive subject matter.

FIG. 14 illustrates a schematic view of a fan 135, including its tangential air flow component 130 and its normal air flow component 132, and a side view of a bent fin heat sink 100 as positioned upon a sectioned IC package 150 on a substrate 160, in accordance with an embodiment of the inventive subject matter.

Fan 135 can be similar or identical to fan 70 shown in FIG. 8. Fan 135 is an axial flow fan having a plurality of fan blades 136, rotating in a direction indicated by arrow 138, and disposed about an axis of rotation 137.

Fan 135, when rotating about axis 137, produces an air flow that can be analyzed as having two different components. A tangential component 130 comprises a plurality of angular vectors 131 generally increasing towards the fan blade periphery. An axial component 132 comprises a plurality of downward vectors 133, again generally increasing towards the fan blade periphery.

Because the fins 102 of bent fin heat sink 100 are angled towards, or face, the tangential component 130, a relatively greater air flow, represented by arrows 140, is captured and flows downward between fins 102, exiting in the direction of arrows 142 beneath bent fin heat sink 100.

Thermal plug 123 of bent fin heat sink 100 is in thermal contact with an IC package 150. IC package 150, illustrated in cross-section, includes a die 154 mounted on a package substrate 152 and covered with a lid or integrated heat spreader (IHS) 158. A thermal grease or phase change material 156 can be used between die 154 and IHS 158. Likewise, a thermal grease or phase change material (not shown) can be used, if desired, between IHS 158 and thermal plug 123. Some of the relative dimensions of the structures shown in FIG. 14 are exaggerated or diminished, and they are not drawn to scale. For example, in a different embodiment the thermal plug 123 could be as wide as IHS 150, with bent fin heat sink 100 accordingly widened to accommodate an IHS 150 of such width.

Figure 15:
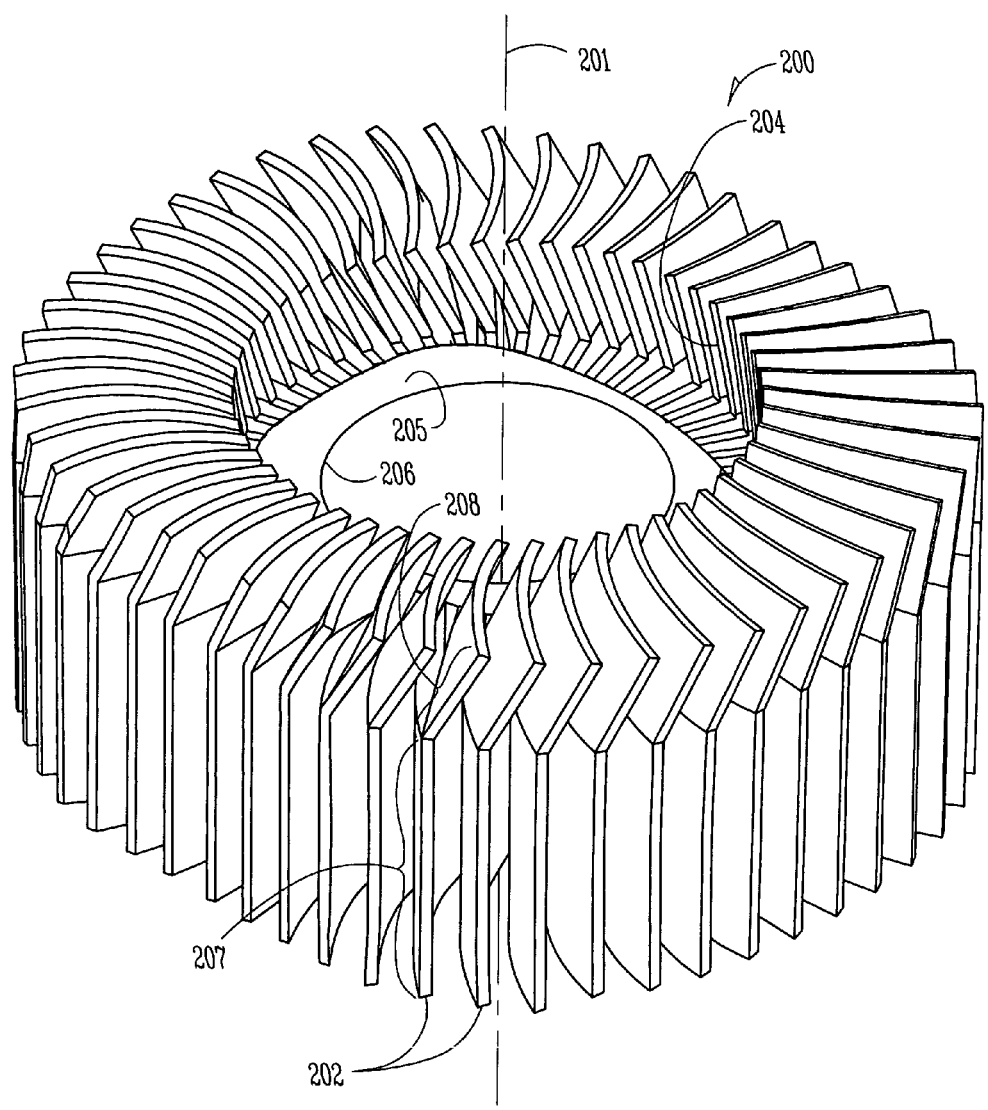
FIG. 15 illustrates a perspective view of a curved-bent fin heat sink, in accordance with an embodiment of the inventive subject matter.

FIG. 15 illustrates a perspective view of a curved-bent fin heat sink 200, in accordance with an embodiment of the inventive subject matter. Curved-bent fin heat sink 200 comprises a plurality of cooling fins 202 arranged about a core 205. Fins 202 are formed of a thermally conductive metal. In one embodiment, fins 202 are formed of aluminum; however, they could also be formed of copper or any other suitable thermally conductive metal or metal alloy.

Core 205 has a central axis 201. Core 205 can optionally have a central cavity 206 for insertion of a thermal plug (not shown). Each fin 202 has a base and a tip. The base of each fin 202 is coupled to core 205 substantially parallel to central axis 201. Each fin 202 is curved between its base and its tip, and the curve of each fin 202 is towards the same relative direction. In the embodiment shown in FIG. 15, each fin 202 is curved towards, or faces, a counterclockwise direction, opposite to the direction of rotation of an axial flow fan to be used in conjunction with heat sink 200.

Each fin 202 comprises a vertical portion 207 and an angled portion 208. The angled portion 208 of each fin 202 is bent in the same relative direction. As will be seen from the description below, the fins 202 of curved-bent fin heat sink 200 are shaped to capture the tangential component of air from an axial flow fan (not shown in FIG. 15 but shown in FIG. 17). They are also shaped to direct a relatively large and relatively high velocity air flow to contact substantially the entire surface of each fin 202, including the hottest portion of each fin 202 adjacent to the core 205.

According to one embodiment of a curved-bent fin heat sink 200, after forming a plurality of curved unbent fins emanating substantially radially from core 205, for example using an extrusion process, the upper portion of the heat sink 200 is counterbored to produce a counterbore 204 in which part of the base (i.e. inner portion) of each fin 202 is sheared from core 205 in the vicinity only of angled portion 208. This allows angled portion 208 of each fin 202 to be bent in a subsequent operation.

In one embodiment, the angle that the angled portion 208 of each fin makes with the vertical portion 207 is approximately 150 degrees. In other embodiments, different angles could be used, depending upon the air flow characteristics of the particular axial flow fan being used in conjunction with the bent fin heat sink.

Figure 16:
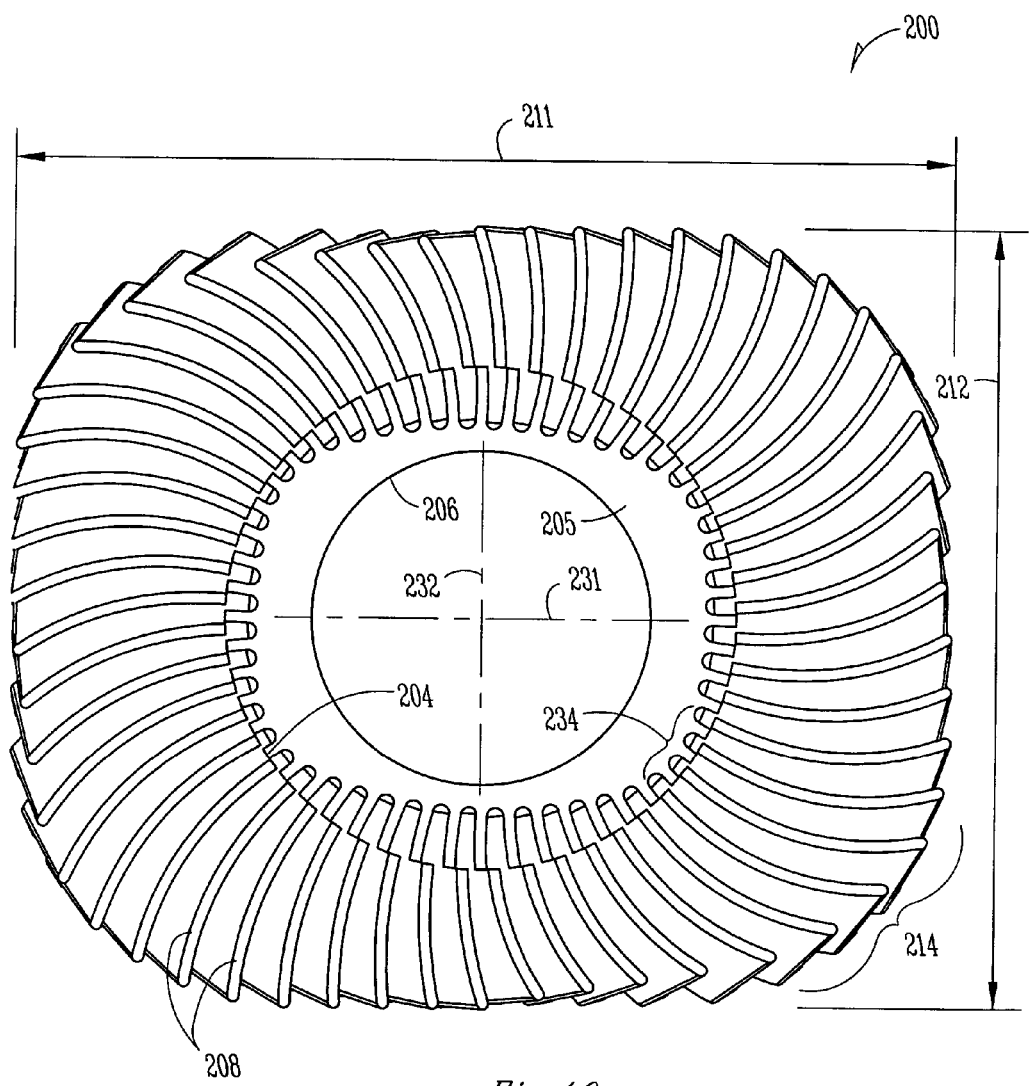
FIG. 16 illustrates a top view of a curved-bent fin heat sink, in accordance with an embodiment of the inventive subject matter.

FIG. 16 illustrates a top view of a curved-bent fin heat sink 200, in accordance with an embodiment of the inventive subject matter. Curved-bent fin heat sink 200 is shaped in order to maximize the number of cooling fins 202 for a desired "semi-rectangular" shape of curved-bent fin heat sink 200.

The semi-rectangular shape of curved-bent fin heat sink 200 can be seen in FIG. 16, in that curved-bent fin heat sink 200 comprises two slightly convex-curved sides of length 211 and two slightly convex-curved ends of length 212. Each side meets a respective end at a rounded corner such as corner 214.

Fins 202 are fabricated, in one embodiment, through an extrusion process followed by a counterboring process and then a bending process. The extrusion process for curved-bent fins is currently subject to basically the same process constraints as for the curved fin heat sink described in FIG. 6. For this reason, the core 205 is shaped to substantially match the shape or footprint of curved-bent fin heat sink 200, which in the embodiment shown in FIG. 16 is a semi-rectangular shape.

Thus, core 205 comprises two slightly convex-curved sides of length 231 and two slightly convex-curved ends of length 232. Each side meets a respective end at a rounded corner such as corner 234. As a result, the aspect ratio of the fins can be maintained substantially uniform around the entire periphery of curved-bent fin heat sink 200. Some variation in aspect ratio of the fins around the periphery of curved-bent fin heat sink 200 is acceptable, so long as the maximum aspect ratio of approximately 10:1 to 12:1 is not exceeded for any fin.

Figure 17:
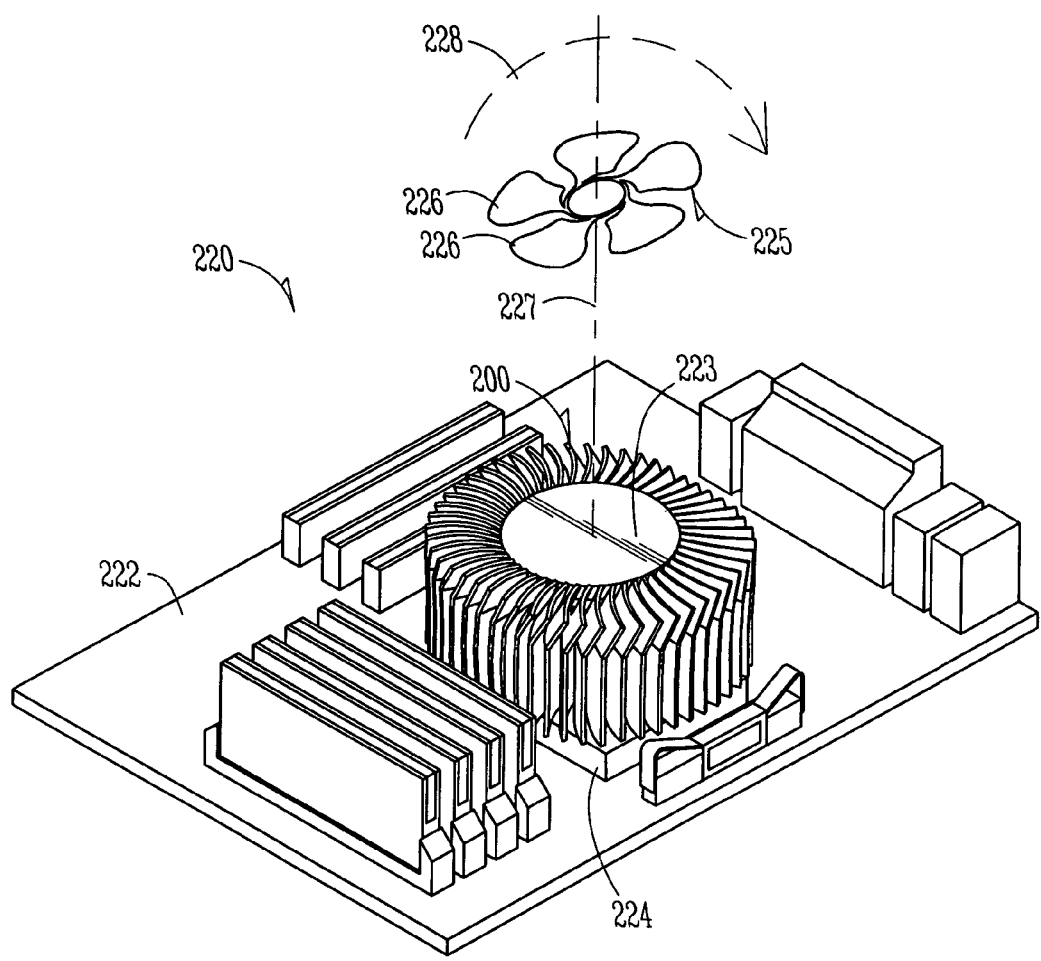
FIG. 17 illustrates a perspective view of an electronic assembly including a curved-bent fin heat sink positioned upon an IC package, in accordance with an embodiment of the inventive subject matter.

FIG. 17 illustrates a perspective view of an electronic assembly 220 including a curved-bent fin heat sink 200 positioned upon an IC package 224, in accordance with an embodiment of the inventive subject matter.

IC package 224 is shown mounted upon a circuit board 222, which can be of similar or identical type to the prior art circuit board illustrated in FIG. 1; however, circuit board 222 can be of any type.

An axial flow fan 225 is shown schematically positioned over curved-bent fin heat sink 200. Fan 225 comprises a plurality of fan blades or impellers 226 that rotate, in the direction indicated by arrow 228, about an axis 227 that is substantially perpendicular to the upper face of curved-bent fin heat sink 200. Curved-bent fin heat sink 200, in this embodiment, comprises a thermal plug 223.

Figure 18:
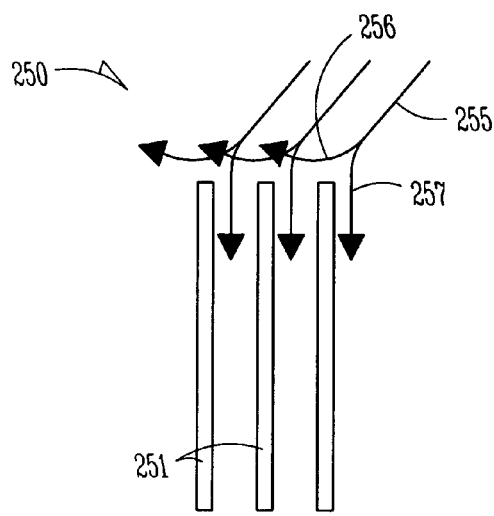
FIG. 18 illustrates an air flow pattern for a prior art radial fin heat sink.

FIG. 18 illustrates an air flow pattern 250 for a prior art radial fin heat sink. Straight, vertical, radially-attached fins 251 each receive an air flow vector 255 from an axial flow fan (not shown) above the heat sink. As mentioned earlier, an axial flow fan produces an air flow having both an axial component directed substantially perpendicular to the upper face of the heat sink, and a tangential component in the direction of rotation of the fan blades.

In FIG. 18, substantially all of the tangential component 256 of air flow vector 255 is deflected away from the opening between adjacent fins 251. The predominant component of air flow into the space between adjacent fins 251 is the axial component 257. However, a portion of axial component 257 is also deflected away and does not go between adjacent fins 251, due to the vertical geometry of the fins. For this fin geometry, there is increased air pressure between the fins, resulting in reduced mass flow and decreased heat dissipation performance.

Figure 19:
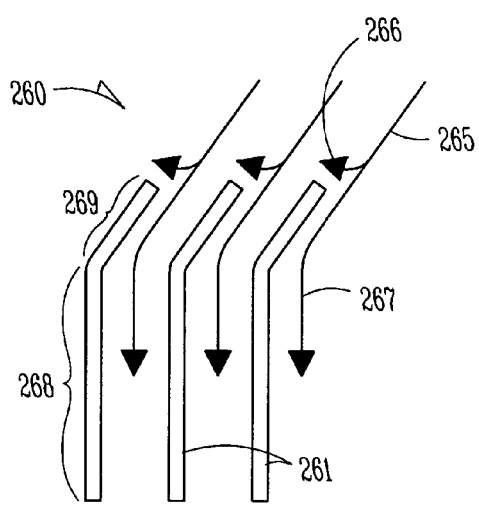
FIG. 19 illustrates an air flow pattern for a bent fin heat sink, in accordance with an embodiment of the inventive subject matter.

FIG. 19 illustrates an air flow pattern 260 for a bent fin heat sink, in accordance with an embodiment of the inventive subject matter. Bent, radially-attached fins 261 each receive an air flow vector 265 from an axial flow fan (not shown) above the heat sink.

In FIG. 19, substantially all of the tangential component of air flow vector 265 is captured by the angled portions 269 of fins 261 and goes into the space between adjacent fins 261, including vertical portions 268, which are the hottest portions of fins 261. Only a small component 266 of the tangential component is deflected away. In addition, little of the axial component 267 is deflected away, as occurs with the heat sink fin geometry of the prior art straight, radial fin heat sink illustrated in FIG. 18, and most of axial component 267 goes between adjacent fins 261.

Figure 20:
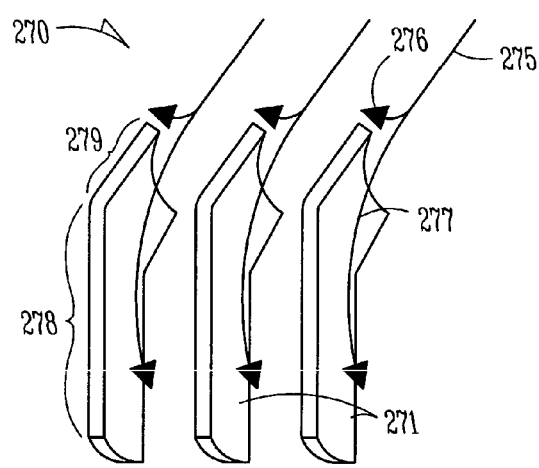
FIG. 20 illustrates an air flow pattern for a curved-bent fin heat sink, in accordance with an embodiment of the inventive subject matter.

FIG. 20 illustrates an air flow pattern 270 for a curved-bent fin heat sink, in accordance with an embodiment of the inventive subject matter. Curved-bent, radially-attached fins 271 each receive an air flow vector 275 from an axial flow fan (not shown) above the heat sink.

In FIG. 20, substantially all of the tangential component of air flow vector 275 is captured by the angled portions 279 of fins 271 and goes into the space between adjacent fins 271, including vertical portions 278, which are the hottest portions of fins 271. Only a small component 276 of the tangential component is deflected away. In addition, little of the axial component 277 is deflected away, as occurs with the heat sink fin geometry of the prior art straight, radial fin heat sink illustrated in FIG. 18, and most of axial component 277 goes between adjacent fins 271.

In addition, the curvature of fins 271 assists in directing the air flow inward towards the heat sink core (not shown, but in this view it would be behind fins 271). Because substantial air flow from the fan (not shown) is captured by the curved-bent heat sink, and because the captured air flow is directed inward towards the heat sink core and the hottest part of fins 271 (next to the core), the curved-bent heat sink is capable of dissipating a significant amount of heat from a heat-producing electronic component with which it is used.

In summary, for the fin geometries of the bent fin heat sink and the curved-bent fin heat sink, there is decreased air pressure between the fins, resulting in increased mass flow and increased heat dissipation performance.

Figure 21:
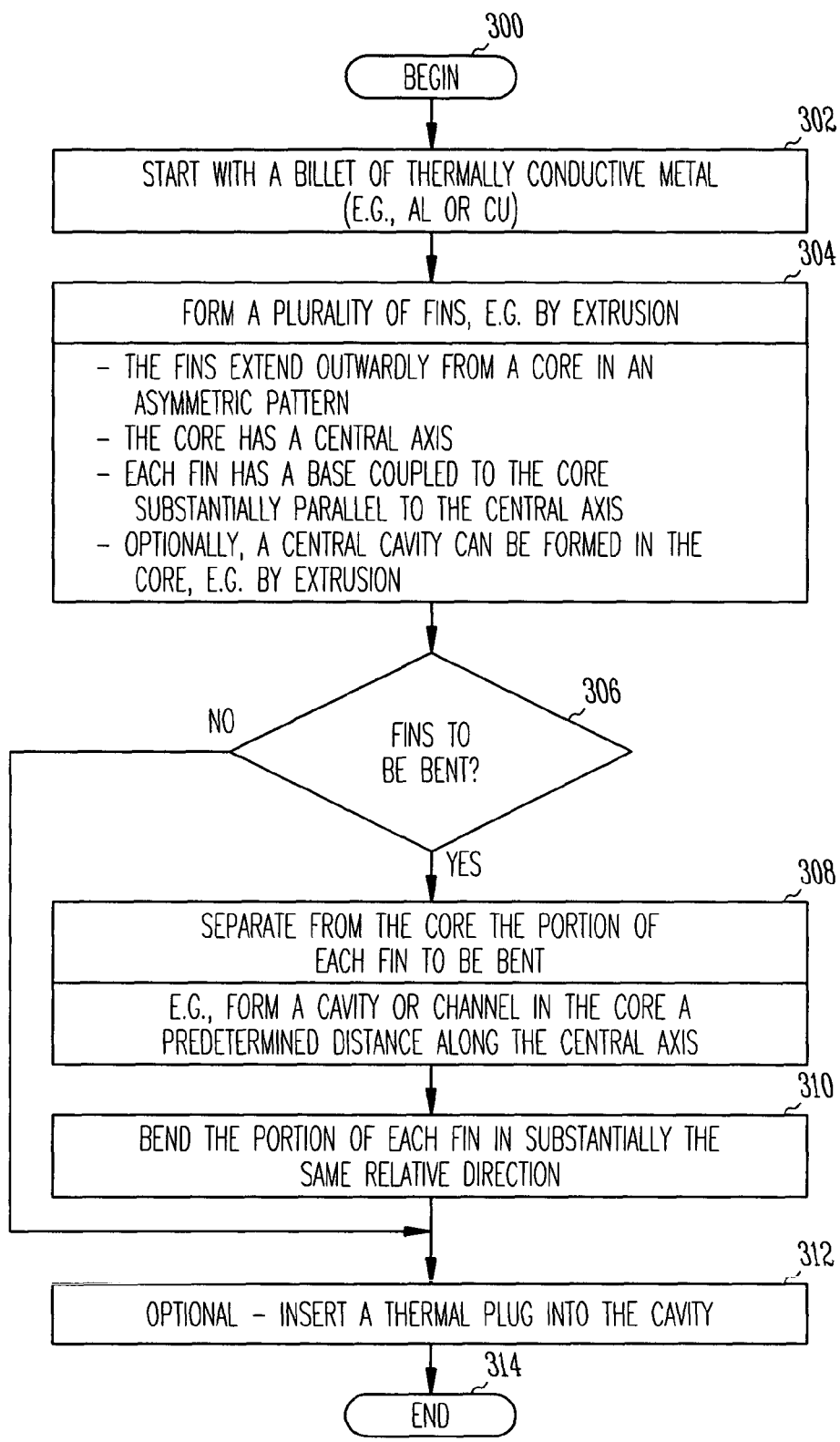
FIG. 21 illustrates a flow diagram of a method of fabricating a heat sink, in accordance with an embodiment of the inventive subject matter.

FIG. 21 illustrates a flow diagram of a method of fabricating a heat sink, in accordance with an embodiment of the inventive subject matter. The method begins at 300.

In 302, a billet of thermally conductive metal, such as aluminum or copper, is obtained.

In 304, a plurality of fins are formed from the billet, for example by an extrusion or micro-forging process. The fins extend outwardly from a core in an asymmetric pattern (in the case of curved fins). The core has a central axis, and each fin has a base that is coupled to the core substantially parallel to the central axis. If desired, a central cavity can be formed in the core. The central cavity can be formed in any suitable manner, for example as part of the extrusion operation.

In 306, if the fins are to be bent, the process goes to 308; otherwise, it goes to 312.

In 308, the portions of the fins to be bent are separated from the core, for example by forming a cavity (e.g. by counterboring) or channel (e.g. by machining or sawing) into the core a predetermined distance along the central axis, from the top of the heat sink.

In 310, a portion of each fin is bent in substantially the same relative direction. In one embodiment, the upper portion of each fin is bent down approximately 30 degrees from vertical, so that the angled portion of the fin forms an angle of approximately 150 degrees with the vertical portion of the fin.

In 312, which is optional depending upon whether a central cavity was formed in 304, a thermal plug is inserted into the central cavity to provide increased thermal dissipation from the IC through the heat sink core to the heat sink fins. The process ends at 314.

Figure 22:
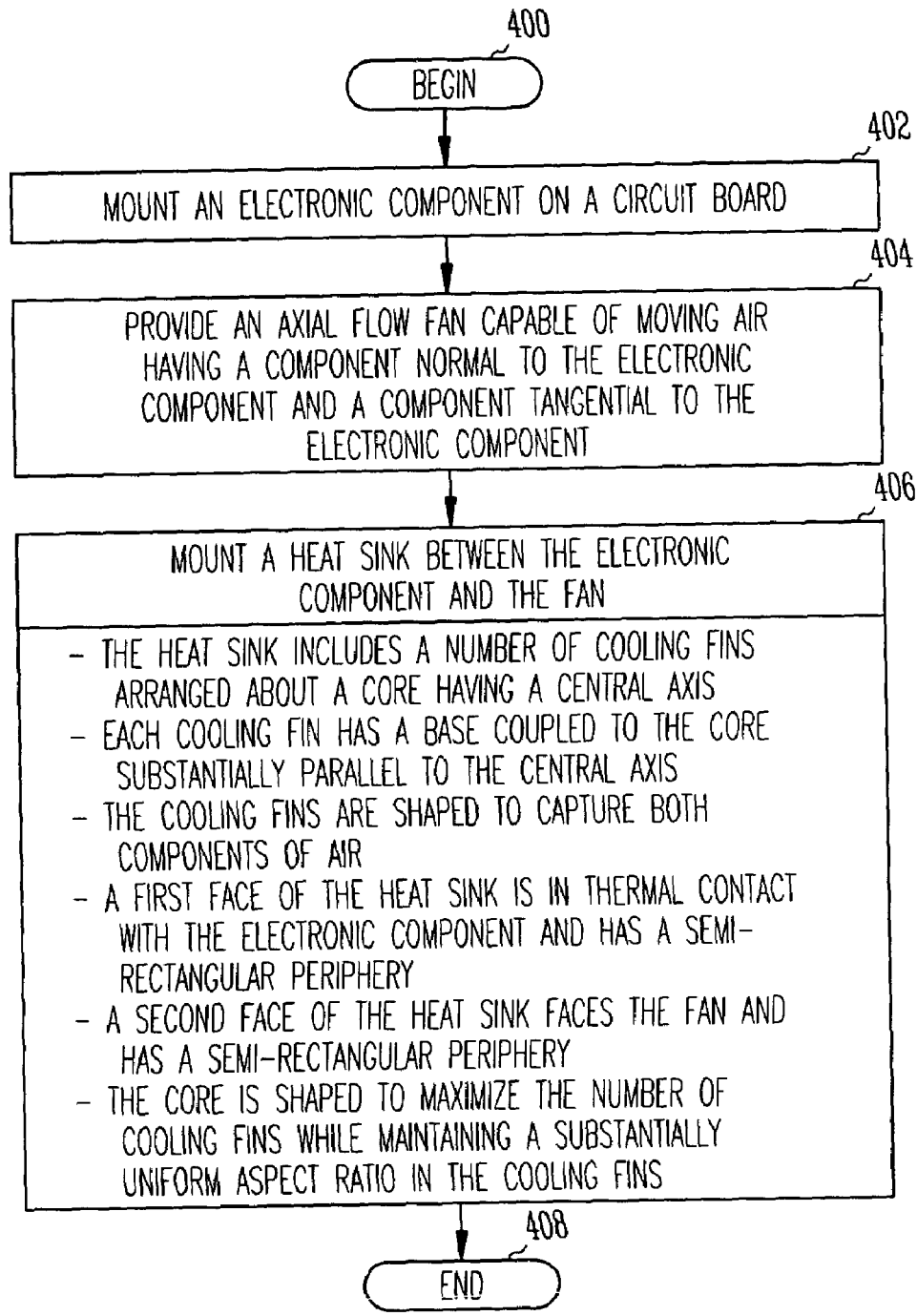
FIG. 22 illustrates a flow diagram of a method of fabricating an electronic assembly, in accordance with an embodiment of the inventive subject matter.

FIG. 22 illustrates a flow diagram of a method of fabricating an electronic assembly, in accordance with an embodiment of the inventive subject matter. The process begins at 400.

In 402, an electronic component is mounted on a circuit board.

In 404, an axial flow fan is provided. The axial flow fan is capable of moving air having a component normal to the electronic component and a component tangential to the electronic component.

In 406, a heat sink is mounted between the electronic component and the axial flow fan. The heat sink includes a number of cooling fins that are arranged about a core having a central axis. Each cooling fin has a base coupled to the core substantially parallel to the central axis. The cooling fins are shaped to capture both components of air, i.e. the axial component and the tangential component. A first face of the heat sink is in thermal contact with the electronic component and has a semi-rectangular periphery. A second face of the heat sink faces the fan and has a semi-rectangular periphery. The second face is substantially opposite the first face. The core is shaped to maximize the number of cooling fins while maintaining a substantially uniform aspect ration in the cooling fins. The method ends at 408.

The operations described above with respect to FIGS. 21 and 22 could be performed in a different order from those described herein. Also, although the flow diagrams of FIGS. 21 and 22 are shown as having a beginning and an end, they can be performed continuously.

Figure 23:
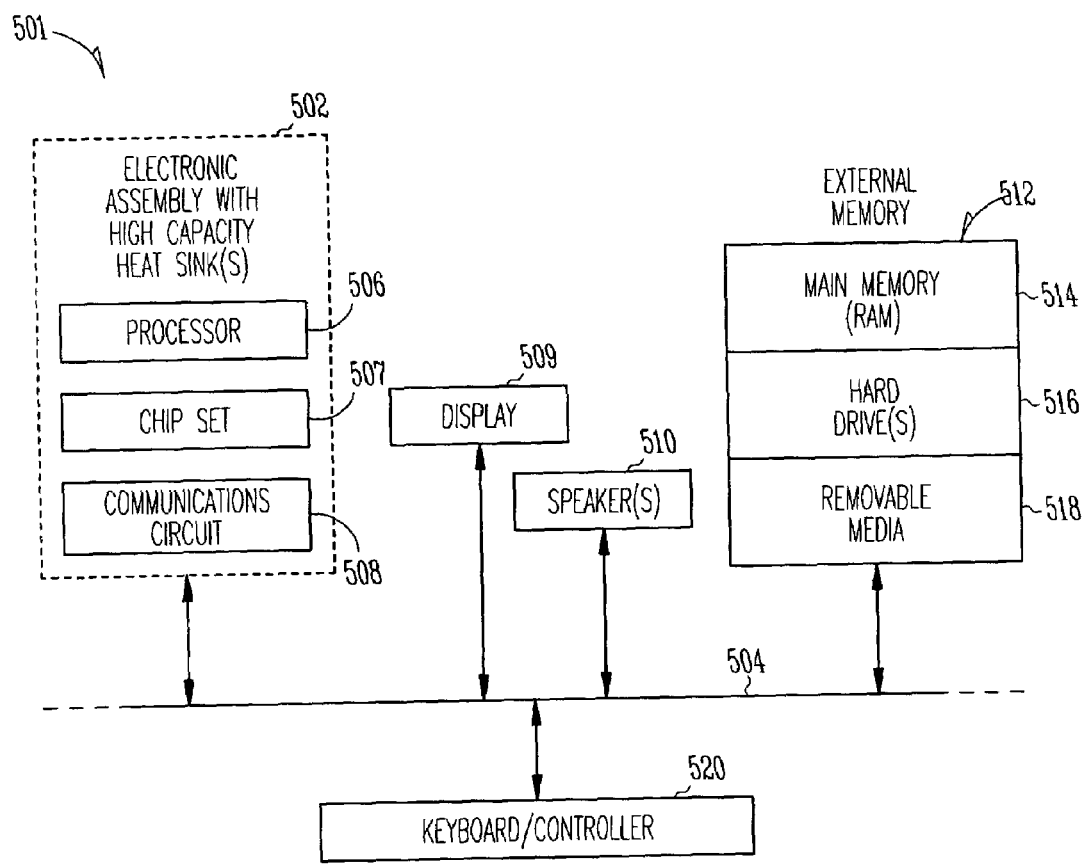
FIG. 23 is a block diagram of an electronic system incorporating at least one electronic assembly with at least one high capacity heat sink, in accordance with an embodiment of the inventive subject matter.

FIG. 23 is a block diagram of an electronic system 501 incorporating at least one electronic assembly 502 with at least one high capacity heat sink, in accordance with an embodiment of the inventive subject matter. Electronic system 501 is merely one example of an electronic system in which embodiments of the inventive subject matter can be used. In this example, electronic system 501 comprises a data processing system that includes a system bus 504 to couple the various components of the system. System bus 504 provides communications links among the various components of the electronic system 501 and can be implemented as a single bus, as a combination of busses, or in any other suitable manner.

Electronic assembly 502 is coupled to system bus 504. Electronic assembly 502 can include any circuit or combination of circuits. In one embodiment, electronic assembly 502 includes a processor 506 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 502 are a chip set 507 and a communications circuit 508. Chip set 507 and communications circuit 508 are functionally coupled to processor 506, and they can be configured to perform any of a wide number of processing and/or communications operations. Other possible types of circuits (not shown) that could be included within electronic assembly 502 include a digital switching circuit, a radio frequency (RF) circuit, a memory circuit, a custom circuit, an application-specific integrated circuit (ASIC), an amplifier, or the like.

Electronic system 501 can also include an external memory 512, which in turn can include one or more memory elements suitable to the particular application, such as a main memory 514 in the form of random access memory (RAM), one or more hard drives 516, and/or one or more drives that handle removable media 518 such as floppy diskettes, compact disks (CDs), digital video disks (DVDs), and the like.

Electronic system 501 can also include a display device 509, one or more speakers 510, and a keyboard and/or controller 520, which can include a mouse, trackball, game controller, voice-recognition device, or any other device that permits a system user to input information into and receive information from the electronic system 501.

FIGS. 1–20 and 23 are merely representational and are not drawn to scale. Certain proportions thereof may be exaggerated, while others may be minimized. FIGS. 5–17, 19, 20, and 23 are intended to illustrate various implementations of the inventive subject matter that can be understood and appropriately carried out by those of ordinary skill in the art.

The inventive subject matter provides for a heat sink and an electronic assembly that minimize thermal dissipation problems associated with high power delivery, and to methods of manufacture thereof. An electronic system and/or data processing system that incorporates one or more electronic assemblies that utilize the inventive subject matter can handle the relatively high power densities associated with high performance integrated circuits, and such systems are therefore more commercially attractive.

By substantially increasing the thermal dissipation from high performance electronic assemblies, such electronic equipment can be operated at increased clock frequencies. Alternatively, such equipment can be operated at reduced clock frequencies but with lower operating temperatures for increased reliability.

As shown herein, the inventive subject matter can be implemented in a number of different embodiments, including a heat sink, an electronic assembly, an electronic system, and various methods, including a method of fabricating a heat sink, and a method of fabricating an electronic assembly. Other embodiments will be readily apparent to those of ordinary skill in the art. The elements, materials, geometries, dimensions, and sequence of operations can all be varied to suit particular packaging and heat-dissipation requirements.

While certain operations have been described herein relative to "upper" and "lower" surfaces, it will be understood that these descriptors are relative, and that they would be reversed if the relevant structure(s) were inverted. Therefore, these terms are not intended to be limiting.

Although specific embodiments have been illustrated and described herein, it will be appreciated by those of ordinary skill in the art that any arrangement that is calculated to achieve the same purpose may be substituted for a specific embodiment shown. This application covers any adaptations or variations of the inventive subject matter. Therefore, it is manifestly intended that embodiments of this subject matter be limited only by the claims and the equivalents thereof.

What is claimed is:

1. A method of making a heat sink, the method comprising:
   obtaining a quantity of thermally conductive metal; and
   forming from the quantity a plurality of fins extending outwardly from a core in an asymmetric pattern, the core having a central axis, each fin having a base coupled to the core substantially parallel to the central axis, each fin farther having a tip, wherein the heat sink has first and second faces that each has a periphery defined by the fin tips, wherein each of the first and second faces comprises inter-fin openings, and wherein the fins are formed curved.

2. The method recited in claim 1, wherein forming comprises extruding the quantity of thermally conductive metal through an extrusion die.

3. The method recited in claim 1, wherein the thermally conductive metal comprises aluminum, and wherein the fins have an aspect ratio in the range of 10:1 to 12:1 or in the range of 14:1 to 16:1.

4. The method recited in claim 1, wherein the thermally conductive metal comprises aluminum, and wherein the radius at the base of the fins is in the range of 1.0 to 1.2 millimeters.

5. The method recited in claim 1, wherein forming comprises making a central cavity within the core.

6. The method recited in claim 5, wherein forming comprises extruding the quantity of thermally conductive metal through an extrusion die.

7. The method recited in claim 6 and further comprising:
   inserting a thermal plug into the cavity.

8. The method recited in claim 7, wherein the thermal plug comprises copper.

9. A method comprising:
   forming from thermally conductive metal a plurality of fins extending outwardly from a core in an asymmetric pattern, the core having a central axis, each fin having a base coupled to the core substantially parallel to the central axis, each fin further having a tip, wherein a face has a periphery defined by the fin tips, wherein the face is to face a heat-generating electrical component, wherein the face comprises inter-fin openings, and wherein the fins are formed curved; and
   bending a portion of each fin in substantially the same relative direction.

10. The method recited in claim 9, wherein before bending the method comprises:
    separating the portion of each fin from the core.

11. The method recited in claim 10, wherein separating comprises: forming a cavity or channel in the core a predetermined distance along the central axis.

12. A method of making a heat sink comprising:
    forming a core having a central axis and a surface to thermally contact a heat-generating component;
    forming from thermally conductive metal a plurality of fins extending outwardly from the core, each fin having a base and a tip, wherein the bases are coupled to the core substantially parallel to the central axis, wherein the tips define the periphery of a face to face the component, wherein the face comprises inter-fin openings, and wherein the fins are formed straight;
    separating a portion of each fin from the core; and
    bending the portion of each fin in substantially the same relative direction.

13. The method recited in claim 12, wherein separating comprises:
    forming a cavity or channel in the core a predetermined distance along the central axis.

14. A method of making a heat sink, the method comprising:
    obtaining a quantity of thermally conductive metal;

forming from the quantity a plurality of fins extending outwardly from a core in an asymmetric pattern, the core having a central axis, each fin having a base coupled to the core substantially parallel to the central axis, each fin further having a tip, wherein a face has a periphery defined by the fin tips, wherein the face is to face a heat-generating electrical component, wherein the face comprises inter-fin openings, and wherein the fins are formed straight;

separating a portion of each fin from the core; and bending the portion of each fin in substantially the same relative direction.

15. The method recited in claim 14, wherein separating comprises:

forming a cavity or channel in the core a predetermined distance along the central axis.

16. The method recited in claim 14, wherein forming comprises extruding the quantity of thermally conductive metal through an extrusion die.

17. The method recited in claim 14, wherein the thermally conductive metal comprises aluminum, and wherein the fins have an aspect ratio in the range of 10:1 to 12:1 or in the range of 14:1 to 16:1.

18. The method recited in claim 14, wherein the thermally conductive metal comprises aluminum, and wherein the radius at the base of the fins is in the range of 1.0 to 1.2 millimeters.

19. The method recited in claim 14, wherein forming comprises making a central cavity within the core.

20. The method recited in claim 19 and further comprising:

inserting a thermal plug into the cavity.

21. The method recited in claim 20, wherein the thermal plug comprises copper.

22. A method of making a heat sink, the method comprising:

obtaining a quantity of thermally conductive metal;

forming from the quantity a plurality of fins extending outwardly from a core in an asymmetric pattern, the core having a central axis, each fin having a base coupled to the core substantially parallel to the central axis, each fin further having a tip, wherein a face has a periphery defined by the fin tips, wherein the face is to face a heat-generating electrical component, wherein the face comprises inter-fin openings, and wherein the fins are formed curved; and bending a portion of each fin in substantially the same relative direction.

23. The method recited in claim 22, wherein before bending the method comprises:

separating the portion of each fin from the core.

24. The method recited in claim 22, wherein separating comprises:

forming a cavity or channel in the core a predetermined distance along the central axis.

25. The method recited in claim 22, wherein forming comprises extruding the quantity of thermally conductive metal through an extrusion die.

26. The method recited in claim 22, wherein the thermally conductive metal comprises aluminum, and wherein the fins have an aspect ratio in the range of 10:1 to 12:1 or in the range of 14:1 to 16:1.

27. The method recited in claim 22, wherein the thermally conductive metal comprises aluminum, and wherein the radius at the base of the fins is in the range of 1.0 to 1.2 millimeters.

28. The method recited in claim 22, wherein forming comprises making a central cavity within the core.

29. The method recited in claim 28 and further comprising:

inserting a thermal plug into the cavity.

30. The method recited in claim 29, wherein the thermal plug comprises copper.

* * * * *

UNITED STATES PATENT AND TRADEMARK OFFICE
CERTIFICATE OF CORRECTION

PATENT NO. : 7,200,934 B2 Page 1 of 1
APPLICATION NO. : 10/656968
DATED : April 10, 2007
INVENTOR(S) : Carter et al.

It is certified that error appears in the above-identified patent and that said Letters Patent is hereby corrected as shown below:

In column 16, line 5, in Claim 1, delete "farther" and insert -- further --, therefor.

Signed and Sealed this

Seventh Day of August, 2007

JON W. DUDAS
*Director of the United States Patent and Trademark Office*